US012811110B2

(12) United States Patent
Akama et al.

(10) Patent No.: US 12,811,110 B2
(45) Date of Patent: Nov. 24, 2026

(54) SUBSTRATE PROCESSING SYSTEM

(71) Applicant: Tokyo Electron Limited, Tokyo (JP)

(72) Inventors: Toshiki Akama, Miyagi (JP); Shusei Kato, Miyagi (JP); Gyeong Min Park, Miyagi (JP); Nobutaka Sasaki, Miyagi (JP); Takashi Aramaki, Miyagi (JP); Lifu Li, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 18/976,345

(22) Filed: Dec. 11, 2024

(65) Prior Publication Data

US 2025/0104979 A1 Mar. 27, 2025

Related U.S. Application Data

(63) Continuation of application No. PCT/JP2023/034825, filed on Sep. 26, 2023.

(30) Foreign Application Priority Data

Sep. 30, 2022 (JP) ................................ 2022-157625

(51) Int. Cl.
*H01J 37/32* (2006.01)
*H10P 72/00* (2026.01)
*H10P 72/72* (2026.01)

(52) U.S. Cl.
CPC .... *H01J 37/32642* (2013.01); *H01J 37/3244* (2013.01); *H01J 37/32715* (2013.01);
(Continued)

(58) Field of Classification Search
CPC ............ H01J 37/32642; H01J 37/3244; H01J 37/32715; H01J 37/32834;
(Continued)

(56) References Cited

U.S. PATENT DOCUMENTS

2002/0144786 A1* 10/2002 Chiang ............ C23C 16/45544 156/345.52
2004/0261946 A1* 12/2004 Endoh ................ H10P 72/0421 156/345.1

(Continued)

FOREIGN PATENT DOCUMENTS

CN 113811987 A * 12/2021 .......... H10P 72/7612
JP 2010-183074 A 8/2010

(Continued)

OTHER PUBLICATIONS

International Search Report and Written Opinion mailed on Dec. 19, 2023, received for PCT Application PCT/JP2023/034825, filed on Sep. 26, 2023, 9 pages including English Translation.

*Primary Examiner* — Abdullah A Riyami
*Assistant Examiner* — Syed M Kaiser
(74) *Attorney, Agent, or Firm* — XSENSUS LLP

(57) ABSTRACT

A substrate processing system including a plasma processing apparatus including a processing container, a decompressed transferrer connected to the plasma processing apparatus, and a controller, a substrate support, a ring placing surface for receiving an edge ring, and an electrostatic chuck for electrostatically attracting the edge ring to the ring placing surface, a supply path for supplying a gas between a rear surface of the edge ring and the ring placing surface, and a pressure sensor connected to the supply path, the edge ring is placed on the ring placing surface, gas is supplied to the supply path to maintain a pressure in the supply path to be higher than a pressure in the processing container, the pressure in the supply path is measured by the pressure sensor to determine a placing state of the edge ring on the ring placing surface.

20 Claims, 21 Drawing Sheets

(52) U.S. Cl.
CPC .. *H01J 37/32834* (2013.01); *H01J 37/32889* (2013.01); *H01J 37/32899* (2013.01); *H10P 72/0606* (2026.01); *H10P 72/72* (2026.01); *H01J 2237/334* (2013.01)

(58) Field of Classification Search
CPC ........... H01J 37/32889; H01J 37/32899; H01J 2237/334; H10P 72/0606; H10P 72/72; H10P 50/242; H10P 72/30; H10P 72/70; H10P 72/7611; H10P 72/0421; H10P 72/0454; H10P 72/3302; H10P 72/50; H10P 72/722; H10P 72/7612; H10P 72/7624; H10P 72/78
See application file for complete search history.

(56) References Cited

U.S. PATENT DOCUMENTS

| | | | | |
|---|---|---|---|---|
| 2018/0166312 | A1* | 6/2018 | Kimball ............ | H01J 37/32082 |
| 2022/0130651 | A1* | 4/2022 | Amikura ........... | H01J 37/32642 |

FOREIGN PATENT DOCUMENTS

| | | | | | |
|---|---|---|---|---|---|
| JP | 2019-534571 | A | | 11/2019 | |
| JP | 2021-010026 | A | | 1/2021 | |
| JP | 2022-069274 | A | | 5/2022 | |
| KR | 20190067931 | A | * | 6/2019 | .......... H10P 72/7624 |

* cited by examiner

SUBSTRATE PROCESSING SYSTEM

CROSS-REFERENCE TO RELATED APPLICATIONS

This application is a bypass continuation application of international application No. PCT/JP2023/034825 having an international filing date of Sep. 26, 2023 and designating the United States, the international application being based upon and claiming the benefit of priority from Japanese Patent Application No. 2022-157625, filed on Sep. 30, 2022, the entire contents of each are incorporated herein by reference.

TECHNICAL FIELD

The present disclosure relates to a substrate processing system.

BACKGROUND

Patent Document 1 discloses a focus ring replacing method for replacing a focus ring that is used in a plasma processing apparatus capable of performing plasma processing on a substrate placed on a stage provided in a processing space, and that is placed on the stage to surround a periphery of the substrate. The replacing method includes an unloading step of unloading the focus ring from the processing space via a transfer device that transfers the focus ring, without exposing the processing space to the atmosphere, and a cleaning step of cleaning a surface of the stage on which the focus ring is placed after the unloading step. The replacing method further includes a loading step of, after the cleaning step, loading the focus ring into the processing space via the transfer device without exposing the processing space to the atmosphere and placing the focus ring on the stage. Patent Document 1 also discloses performing charge neutralization before the unloading step when the focus ring is attracted to the stage by an electrostatic chuck.

CITATION LIST

Patent Documents

Patent Document 1: JP2018-10992A

SUMMARY

In the technique according to the present disclosure, an edge ring is accurately placed on a substrate support.

According to an aspect of the present disclosure, there is provided a substrate processing system having a plasma processing apparatus, a pressure-reduced transfer device connected to the plasma processing apparatus, and a controller, in which the plasma processing apparatus has a processing container configured to be pressure-reduced, a substrate support that is provided in the processing container and that includes a substrate placing surface, a ring placing surface on which an edge ring is placed to surround the substrate placing surface, and an electrostatic chuck that electrostatically attracts the edge ring to the ring placing surface, an elevation mechanism that elevates the edge ring with respect to the ring placing surface, a supply path for supplying a gas to a space between a rear surface of the edge ring and the ring placing surface, and a pressure sensor connected to the supply path, the pressure-reduced transfer device has a transfer robot that transfers the edge ring, and the controller controls lowering the edge ring that is transferred into the processing container by the transfer robot and that is transferred to the elevation mechanism, via the elevation mechanism and placing the edge ring on the ring placing surface, electrostatically attracting the placed edge ring to the ring placing surface, supplying the gas to the supply path to maintain a pressure in the supply path to be higher than a pressure in the processing container after the electrostatic attracting, measuring the pressure in the supply path, and determining a placing state of the edge ring on the ring placing surface based on the measured pressure.

According to the present disclosure, an edge ring can be accurately placed on a substrate support.

DETAILED DESCRIPTION

Figure 1:
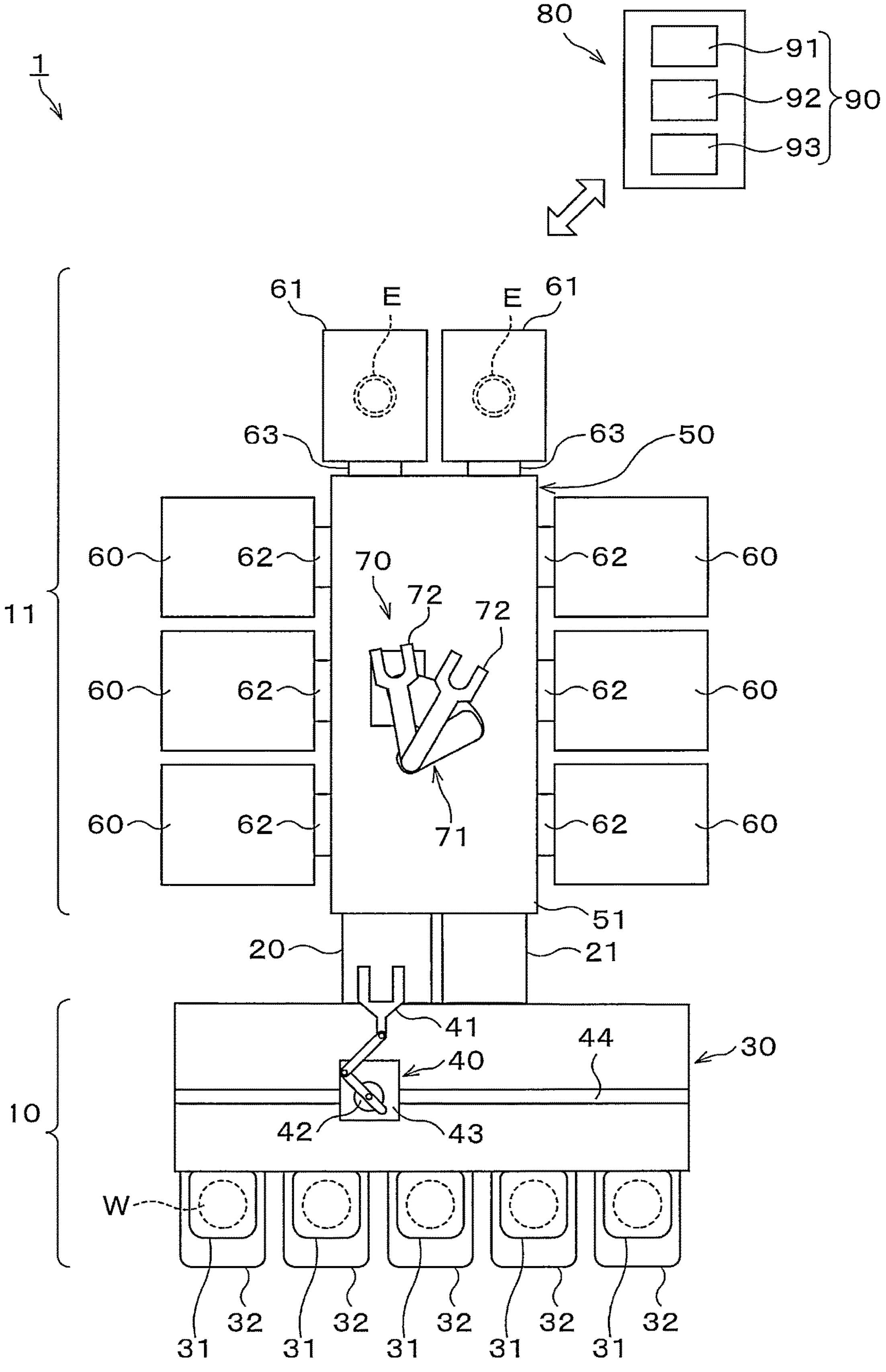
FIG. 1 is a plan view showing a schematic configuration of a plasma processing system as a substrate processing system according to one or more embodiments of the present application embodiment.

In a manufacturing process of a semiconductor device or the like, a substrate such as a semiconductor wafer (hereinafter referred to as "wafer") is subjected to substrate processing such as etching processing using a plasma, that is, plasma processing. The plasma processing is performed in a state where the substrate is placed on a substrate support in a pressure-reduced processing container.

In order to obtain an accurate and uniform plasma processing result at a central portion and a peripheral portion of the substrate, a structure (also referred to as a member) having an annular shape in plan view, which is so-called a focus ring, an edge ring, or the like (hereinafter referred to as "edge ring"), may be placed on the substrate support to surround a periphery of the substrate on the substrate support.

Since the result of the plasma processing depends on a temperature of the substrate, a temperature of the substrate support is adjusted during the plasma processing, and the temperature of the substrate is adjusted through the substrate support.

When the edge ring is used, temperature adjustment of the edge ring is also important because a temperature of the edge ring affects the plasma processing result of the peripheral portion of the substrate. Thus, the temperature of the edge ring is also adjusted through the substrate support.

However, when the substrate and the edge ring are simply placed on the substrate support, a vacuum heat insulating layer is formed between the substrate support and the substrate and the edge ring, and temperature adjustment through the substrate support cannot be appropriately performed. In order to improve this point, an electrostatic chuck is provided on the substrate support, and the substrate and the edge ring are electrostatically attracted to the electrostatic chuck.

Further, since the edge ring is etched and consumed by being exposed to the plasma, it is necessary to replace the edge ring. Generally, replacement when the edge ring is consumed is performed by a worker by exposing the processing container to the atmosphere. However, it is also considered to perform replacement without exposing the processing container to the atmosphere using a transfer device that transfers the edge ring (see Patent Document 1).

In the case of using the edge ring, it is necessary to set an appropriate position of the edge ring with respect to the substrate support to obtain a uniform processing result in a circumferential direction at the peripheral portion of the substrate. Specifically, for example, positions of a center of the electrostatic chuck and a center of the edge ring need to be substantially the same.

However, when the edge ring is placed on the electrostatic chuck of the substrate support using the transfer device that transfers the edge ring, the position of the edge ring with respect to the substrate support may be inappropriate (e.g., misaligned, including misaligned greater than a threshold amount). Even when the position is appropriate at a time of placing, the edge ring may be misaligned with respect to the substrate support when the edge ring is electrostatically attracted, and the position may be inappropriate.

Therefore, in the technique according to the present disclosure, the edge ring is accurately placed on the substrate support.

Hereinafter, a substrate processing system according to one or more embodiments of the present application will be described with reference to the drawings. Like reference numerals will be given to like parts having substantially the same functions throughout the specification and the drawings, and redundant description thereof will be omitted.

Plasma Processing System

Figure 2:
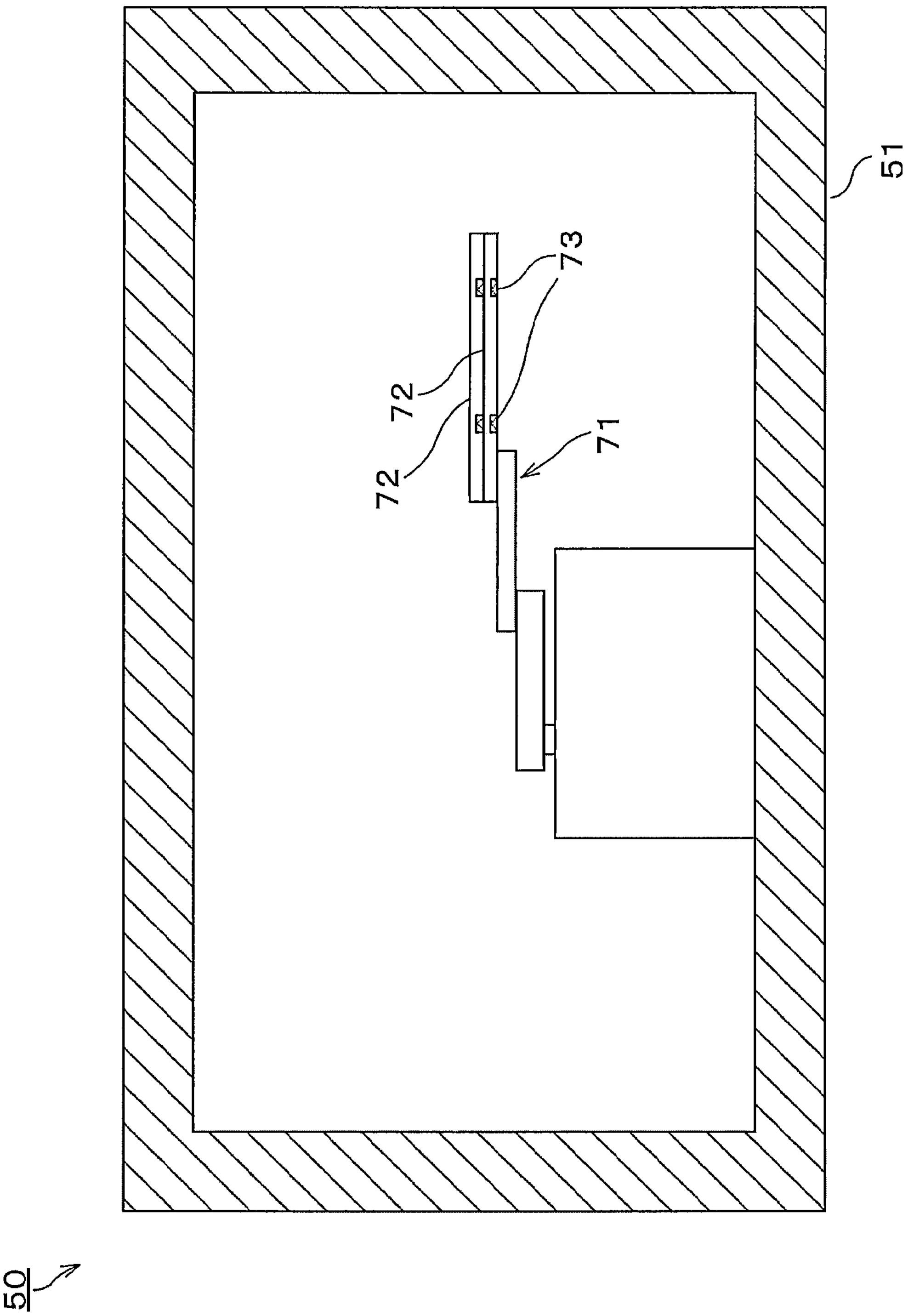
FIG. 2 is a diagram showing a schematic configuration of a transfer robot provided in a transfer module.

FIG. 1 is a plan view showing a schematic configuration of a plasma processing system as the substrate processing system according to one or more embodiments of the present application. FIG. 2 is a diagram showing a schematic configuration of a transfer robot provided in a transfer module (described later).

In a plasma processing system 1 in FIG. 1, a wafer W that is the substrate is processed. Specifically, the wafer W is subjected to the substrate processing such as the etching processing using the plasma, that is, the plasma processing.

The plasma processing system 1 includes an atmospheric section 10 and a decompression section 11, and the atmospheric section 10 and the decompression section 11 are integrally connected to each other through load-lock modules 20 and 21. The atmospheric section 10 includes an atmospheric module for performing desired processing on the wafer W under an atmospheric pressure atmosphere. The decompression section 11 includes a decompression module for performing desired processing on the wafer W under a pressure-reduced atmosphere (vacuum atmosphere).

The load-lock modules 20 and 21 are connected to a loader module 30 of the atmospheric section 10 and a transfer module 50 of the decompression section 11 through gate valves (not shown). The load lock modules 20 and 21 are configured to temporarily hold the wafer W. Further, each of the load-lock modules 20 and 21 is configured such that an inner space thereof can be switched between an atmospheric pressure atmosphere and a pressure-reduced atmosphere.

The atmospheric section 10 includes the loader module 30 including a transfer device 40 (described later), and load ports 32 for placing hoops 31. The hoops 31 can store a plurality of wafers W. An orienter module (not shown) that adjusts an orientation of the wafer W in a horizontal direction, a buffer module (not shown) that temporarily stores the plurality of wafers W, and the like may be connected to the loader module 30.

The loader module 30 has a rectangular housing, and an inner space of the housing is maintained in an atmospheric pressure atmosphere. A plurality of load ports 32, for example, five load ports 32, are disposed side by side on one side surface forming a long side of the housing of the loader module 30. The load-lock modules 20 and 21 are disposed side by side on the other longitudinal side the housing of the loader module 30.

The transfer device 40 configured to hold and transfer the wafer W is provided in the housing of the loader module 30. The transfer device 40 includes a transfer arm 41 that supports the wafer W during transfer, a rotor 42 that rotatably supports the transfer arm 41, and a base 43 on which the rotor 42 is placed. Further, a guide rail 44 extending in a longitudinal direction of the loader module 30 is disposed in the loader module 30. The base 43 is disposed on the guide rail 44, and the transfer device 40 is configured to be movable along the guide rail 44.

The decompression section 11 includes the transfer module 50 serving as a pressure-reduced transfer device, a processing module 60 serving as a plasma processing apparatus, and an accommodation module 61 serving as an accommodation. An inner space of each of the transfer module 50 and the processing module 60 (specifically, an inner space of each of a pressure-reduced transfer space 51 and a chamber 100 (described later)) is maintained in a pressure-reduced atmosphere, and an inner space of the accommodation module 61 is also maintained in a pressure-reduced atmosphere. A plurality of processing modules 60, for example, six processing modules 60, and a plurality of accommodation modules 61, for example, two accommodation modules 61, are provided for one transfer module 50. The number and disposition of the processing modules 60 are not limited to those in one or more embodiments of the present application and may be freely set as long as at least one processing module including a wafer support (described later) is provided. The number and disposition of the accommodation modules 61 are also not limited to those in one or more embodiments of the present application and can be freely set. For example, at least one accommodation module 61 is provided.

The transfer module 50 is configured to transfer the wafer W in the inner space thereof. The transfer module 50 is also configured to transfer an edge ring E (described later) in the inner space thereof.

The transfer module 50 includes the pressure-reduced transfer space 51 having a housing of a polygonal shape in plan view (in the shown example, a quadrangular shape in plan view). The pressure-reduced transfer space 51 is connected to the load-lock modules 20 and 21.

The transfer module 50 is configured to transfer the wafer W loaded in the load-lock module 20 to one processing module 60 and unload the wafer W subjected to desired plasma processing in the processing module 60 into the load-lock module 21.

Further, the transfer module 50 may transfer the edge ring E in the accommodation module 61 to one processing module 60 and unload the edge ring E in the processing module 60 into the accommodation module 61.

The processing module 60 performs the desired plasma processing, for example, the etching processing, on the wafer W transferred from the transfer module 50. Further, the processing modules 60 are connected to the transfer module 50 through gate valves 62. A specific configuration of the processing module 60 will be described later.

The accommodation module 61 accommodates the edge ring E. Further, the accommodation module 61 is connected to the transfer module 50 through a gate valve 63.

A transfer robot 70 is provided in the pressure-reduced transfer space 51 of the transfer module 50. The transfer robot 70 is configured to hold and transfer the wafer W. The transfer robot 70 is also configured to hold and transfer the edge ring E.

The transfer robot 70 includes a transfer arm 71 that is configured to be swivelled, retracted, and elevated in a state of holding the wafer W. A tip of the transfer arm 71 branches into forks 72 and 72 serving as two holders. The forks 72 and 72 are configured to hold the wafer W and the edge ring E to be transferred, respectively. Further, as shown in FIG. 2, at least any one of the forks 72 and 72 may be provided with a measurement unit 73. The measurement unit 73 measures information related to a misalignment amount of the edge ring E with respect to an electrostatic chuck (described later) provided in the processing module 60. The measurement unit 73 includes, for example, a distance sensor (not shown).

In the transfer module 50, the wafer W held in the load-lock module 20 is received by the transfer arm 71 and is loaded into the processing module 60. Further, the wafer W subjected to desired processing in the processing module 60 is received by the transfer arm 71 and is unloaded into the load-lock module 21.

Further, in the transfer module 50, the transfer arm 71 may receive the edge ring E in the accommodation module 61 and load the edge ring E into the processing module 60. Further, in the transfer module 50, the transfer arm 71 may receive the edge ring E in the processing module 60 and unload the edge ring E into the accommodation module 61.

The plasma processing system 1 further includes a controller 80. In one or more embodiments of the present application, the controller 80 processes computer-executable instructions for causing the plasma processing system 1 to perform various steps described in the present disclosure. The controller 80 may be configured to control each of other components of the plasma processing system 1 such that the plasma processing system 1 performs the various steps to be described here. In one or more embodiments of the present application, the controller 80 may be partially or entirely included in the components of the plasma processing system 1. For example, the controller 80 may include a computer 90. For example, the computer 90 may include a processor (CPU: central processing unit) 91, a storage unit 92, and a communication interface 93. The functionality of the elements disclosed herein may be implemented using circuitry or processing circuitry which includes general purpose processors, special purpose processors, integrated circuits, ASICs ("Application Specific Integrated Circuits"), FPGAs ("Field-Programmable Gate Arrays"), conventional circuitry and/or combinations thereof which are programmed, using one or more programs stored in one or more memories, or otherwise configured to perform the disclosed functionality. Processors and controllers are considered processing circuitry or circuitry as they include transistors and other circuitry therein. In the disclosure, the circuitry, units, or means are hardware that carry out or are programmed to perform the recited functionality. The hardware may be any hardware disclosed herein which is programmed or configured to carry out the recited functionality. The processor 91 may be configured to perform various control operations and calculations based on a program stored in the storage unit 92. The storage unit 92 may include a random access memory (RAM), a read only memory (ROM), a hard disk drive (HDD), a solid state drive (SSD), or a combination thereof. The communication interface 93 may communicate with the components of the plasma processing system 1 through a communication line such as a local area network (LAN).

Wafer Processing in Plasma Processing System 1

Next, an example of wafer processing using the plasma processing system 1 configured as described above will be described.

First, the wafer W is acquired from a desired hoop 31 by the transfer device 40 and loaded into the load-lock module 20 by the transfer device 40. Next, the load-lock module 20 is sealed and decompressed. Thereafter, the inner space of the load-lock module 20 communicates with the inner space of the transfer module 50.

Next, the wafer W is held by the transfer robot 70 and is transferred from the load-lock module 20 to the transfer module 50.

Next, the gate valve 62 corresponding to the desired processing module 60 is open, and the wafer W is loaded into the desired processing module 60 by the transfer robot 70. Then, the gate valve 62 is closed, and the wafer W is subjected to desired processing in the processing module 60. The processing performed on the wafer W in the processing module 60 will be described later.

Next, the gate valve 62 is open, and the wafer W is unloaded from the processing module 60 by the transfer robot 70. Then, the gate valve 62 is closed.

Next, the wafer W is loaded into the load-lock module 21 by the transfer robot 70. When the wafer W is loaded into the load-lock module 21, the load-lock module 21 is sealed and exposed to the atmosphere. Then, the inner space of the load-lock module 21 communicates with the inner space of the loader module 30.

Next, the wafer W is held by the transfer device 40 and is returned to the desired hoop 31 to be accommodated from the load-lock module 21 through the loader module 30. This ends the wafer processing using the plasma processing system 1.

Processing Module 60

Figure 3:
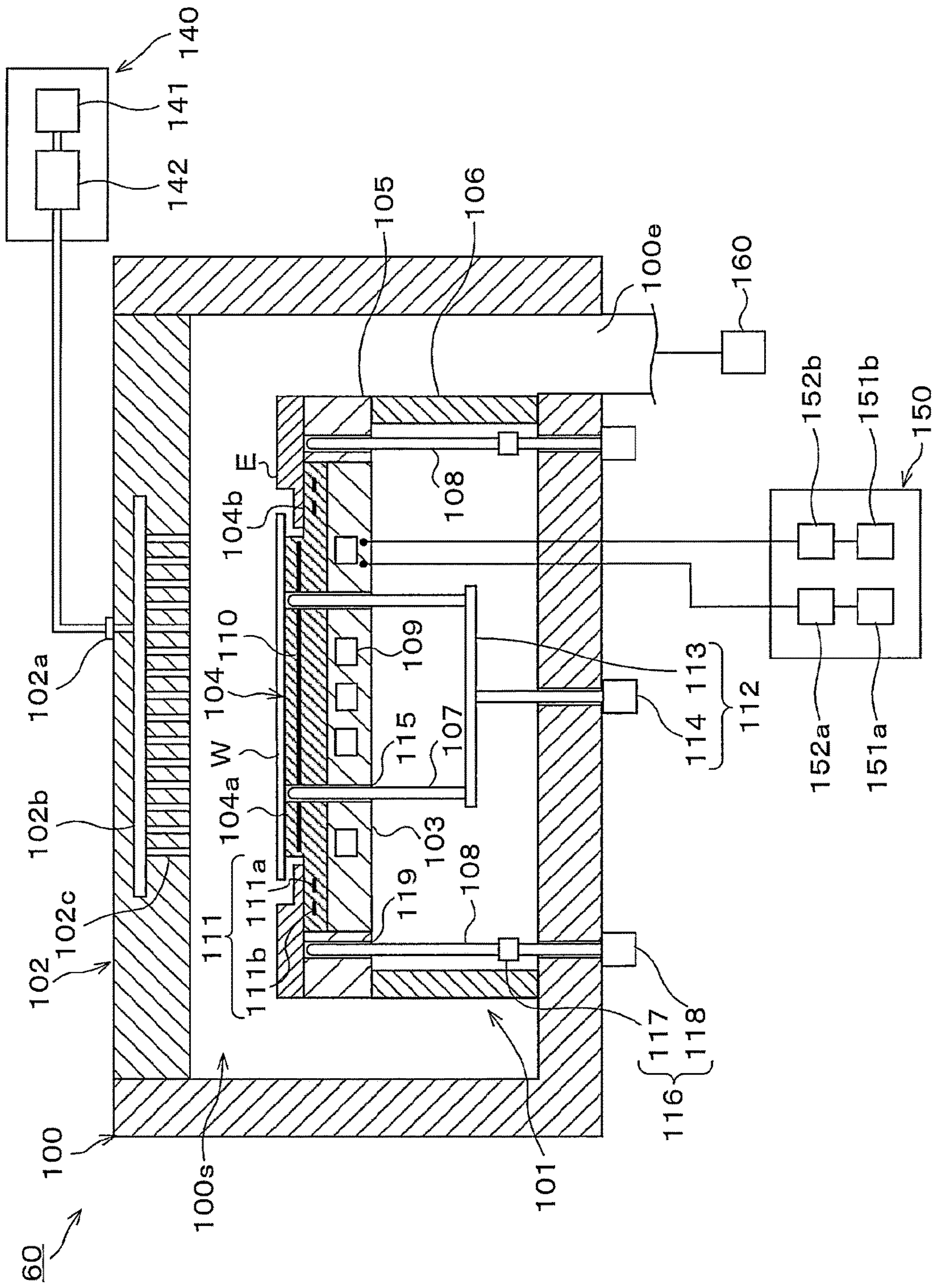
FIG. 3 is a vertical cross-sectional view showing a schematic configuration of a processing module.
Figure 4:
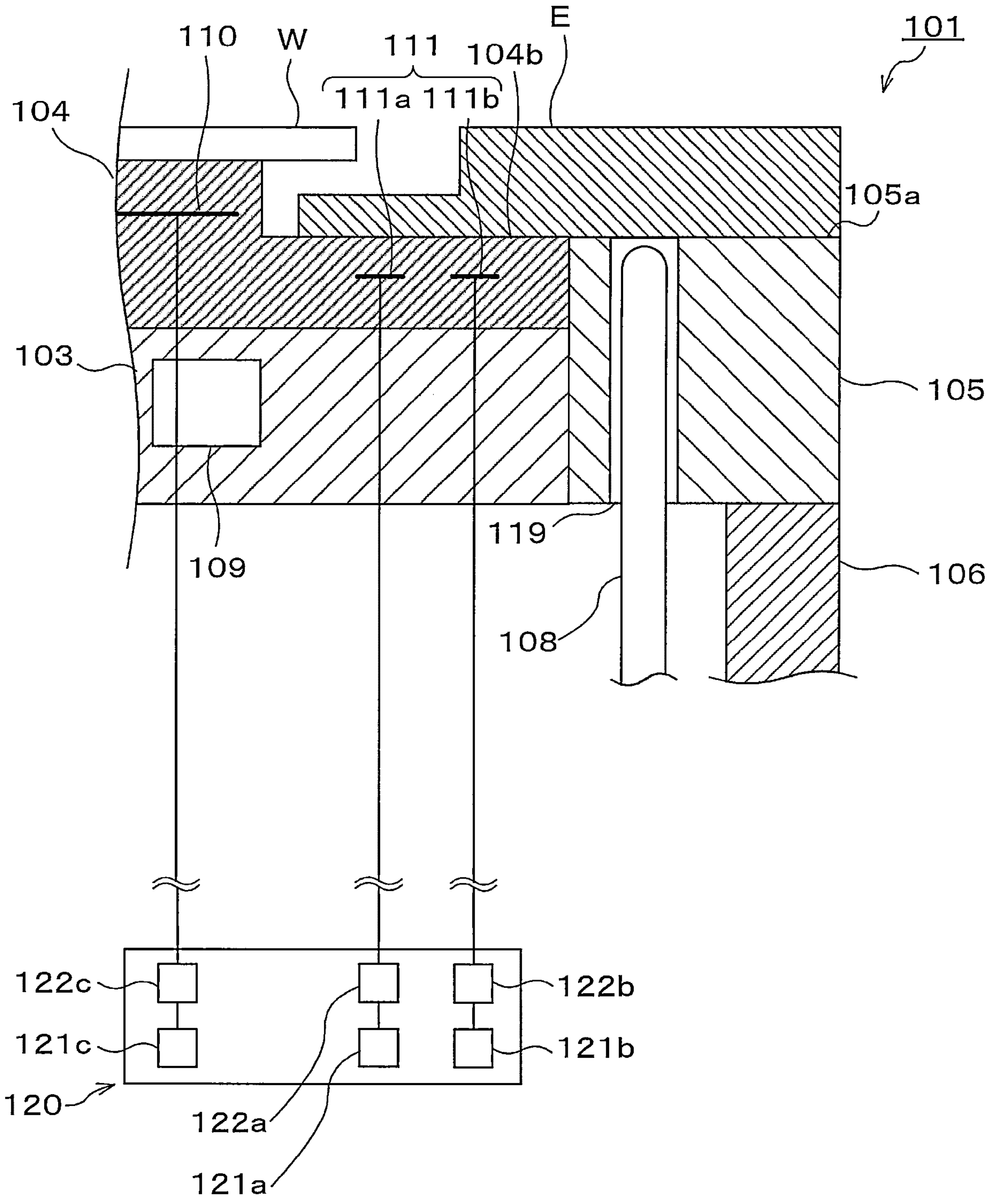
FIG. 4 is a partially enlarged view of FIG. 3.
Figure 5:
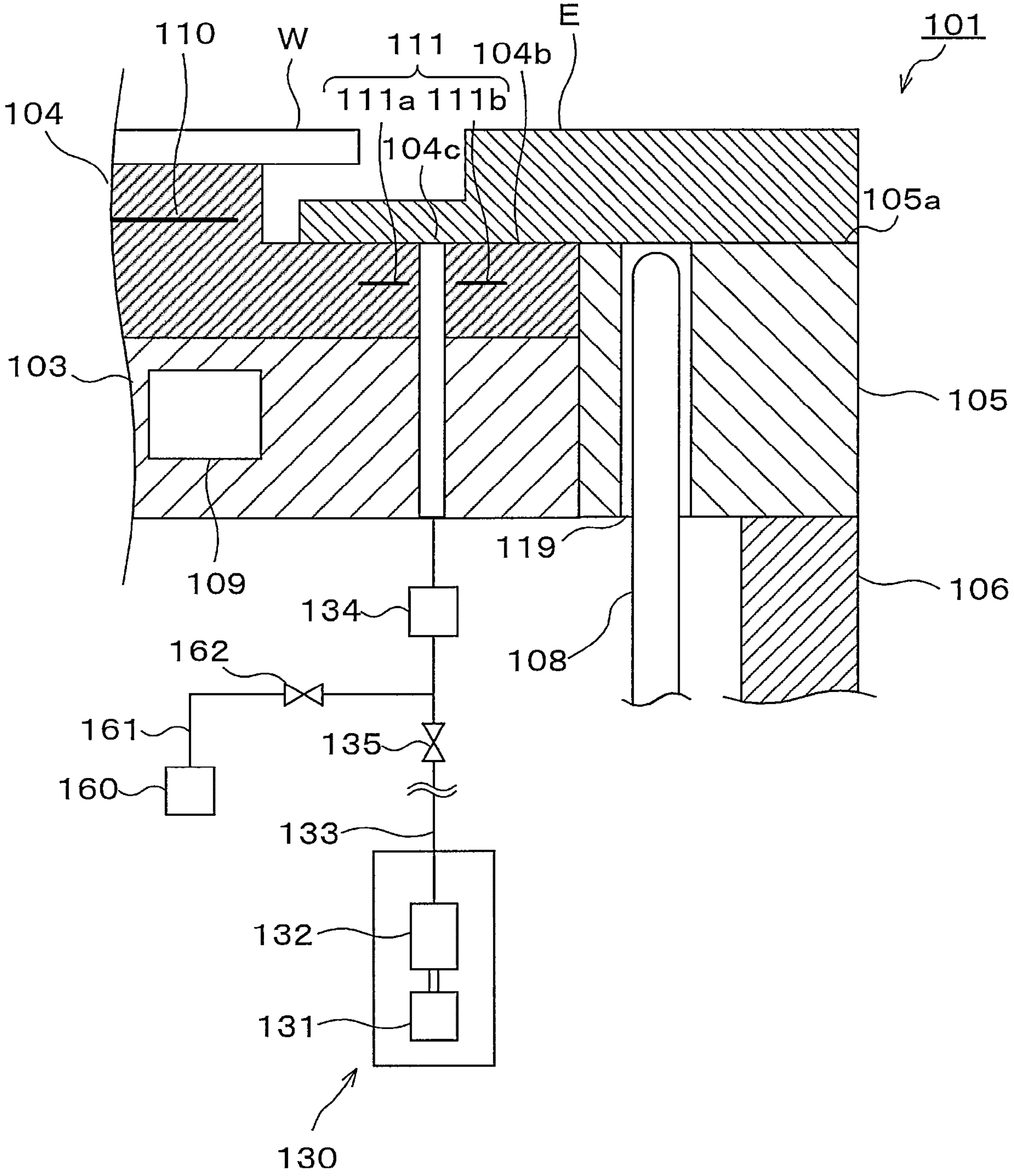
FIG. 5 is an enlarged cross-sectional view of a part different from FIG. 4 in a circumferential direction of a wafer support.

Next, the processing module 60 will be described with reference to FIGS. 3 to 5. FIG. 3 is a vertical cross-sectional view showing a schematic configuration of the processing module 60. FIG. 4 is a partially enlarged view of FIG. 3. FIG. 5 is an enlarged cross-sectional view of a part different from FIG. 4 in a circumferential direction of a wafer support 101 (described later).

As shown in FIG. 3, the processing module 60 includes the chamber 100 serving as a processing container, a gas supply 140, a radio frequency (RF) power supply 150, and an exhaust system 160. The processing module 60 also includes a voltage application unit 120 (see FIG. 4) and a gas supply 130 (see FIG. 5). The processing module 60 further includes the wafer support 101 serving as a substrate support and an upper electrode 102.

The chamber 100 has an inner space that is configured to be decompressed, and defines a processing space 100*s* in which the plasma is generated. Further, the wafer support 101 and the like are provided in the chamber 100. For example, aluminum can be used as a material of the chamber 100. Further, the chamber 100 is connected to a ground potential.

For example, the wafer support 101 is disposed in a lower region of the chamber 100. The upper electrode 102 is disposed above the wafer support 101 and may function as a part of a ceiling of the chamber 100.

The wafer support 101 is configured to support the wafer W. In one embodiment, the wafer support 101 includes a lower electrode 103, an electrostatic chuck 104, a support 105, an insulator 106, a lifter 107, and a lifter 108. The wafer support 101 is also configured to support the edge ring E. The wafer support 101 may or may not include the edge ring E as a constituent member thereof.

The lower electrode 103 is made of a conductive material such as aluminum. In one or more embodiments of the present application, a flow path 109 of a temperature-controlled fluid is formed in the lower electrode 103. The temperature-controlled fluid is supplied to the flow path 109 from a chiller unit (not shown) provided outside the chamber 100. The temperature-controlled fluid supplied to the flow path 109 returns to the chiller unit. For example, the wafer support 101 (specifically, the electrostatic chuck 104), the wafer W, or the edge ring E can be cooled to a predetermined temperature by circulating, for example, low-temperature brine as the temperature-controlled fluid through the flow path 109. For example, the wafer support 101 (specifically, the electrostatic chuck 104), the wafer W, or the edge ring E can be heated to a predetermined temperature by circulating, for example, high-temperature brine as the temperature-controlled fluid through the flow path 109.

When a temperature control mechanism is provided in the wafer support 101, a form of the temperature control mechanism is not limited to the flow path 109 and may be, for example, another form such as a resistance heating type heater. Further, a member in which the temperature control mechanism is disposed in the wafer support 101 is not limited to the lower electrode 103 and may be another member.

The electrostatic chuck 104 is a member configured to electrostatically attract at least the edge ring E and is provided on the lower electrode 103. The electrostatic chuck 104 may also be configured to electrostatically attract the wafer W. In one or more embodiments of the present application, a central portion of the electrostatic chuck 104 constitutes a substrate stage. Further, in one or more embodiments of the present application, in the electrostatic chuck 104, an upper surface of the central portion is formed to be higher than an upper surface of a peripheral portion. In one or more embodiments of the present application, the wafer W is placed on an upper surface 104*a* of the central portion of the electrostatic chuck 104, and the edge ring E is placed on an upper surface 104*b* of the peripheral portion of the electrostatic chuck 104. That is, in one or more embodiments of the present application, the upper surface 104*a* of the central portion of the electrostatic chuck 104 serves as a wafer placing surface as a substrate placing surface on which the wafer W is placed, and the upper surface 104*b* of the peripheral portion of the electrostatic chuck 104 serves as a ring placing surface on which the edge ring E is placed to surround the substrate placing surface.

The edge ring E is a member disposed to surround the wafer W and is specifically a member disposed to surround the wafer W placed on the electrostatic chuck 104. In one or more embodiments of the present application, the edge ring E is disposed to surround the central portion having a higher position of the upper surface than the peripheral portion in the electrostatic chuck 104. The edge ring E is formed to have an annular shape in plan view. Si, $SiO_2$, or the like is used as a material of the edge ring E.

An electrode 110 for electrostatically attracting the wafer W to the upper surface 104*a* of the central portion may be provided in the central portion of the electrostatic chuck 104. Further, an electrode 111 for electrostatically attracting the edge ring E to the upper surface 104*b* of the peripheral portion is provided in the peripheral portion of the electrostatic chuck 104. The electrode 111 is, for example, a bipolar electrode that includes a pair of electrodes 111*a* and 111*b* formed at positions different from each other.

The electrostatic chuck 104 has a configuration in which the electrodes 110 and 111 are interposed between insulating members made of, for example, an insulating material.

As shown in FIG. 4, the voltage application unit 120 is connected to the electrode 111 to generate an electric force (specifically, for example, a coulomb force) for electrostatically attracting the edge ring E. When the electrode 111 is a bipolar electrode, any one of voltages of polarities different from each other or voltages of the same polarity are configured to be selectively applied to the pair of electrodes 111*a* and 111*b* from the voltage application unit 120.

The voltage application unit 120 includes, for example, two direct-current power supplies 121*a* and 121*b* and two switches 122*a* and 122*b*.

The direct-current power supply 121*a* is connected to the electrode 111*a* through the switch 122*a* and selectively applies a positive voltage or a negative voltage for electrostatically attracting the edge ring E to the electrode 111*a*.

The direct-current power supply 121*b* is connected to the electrode 111*b* through the switch 122*b* and selectively applies a positive voltage or a negative voltage for electrostatically attracting the edge ring E to the electrode 111*b*.

The voltage application unit 120 may include a direct-current power supply 121*c* and a switch 122*c*.

The direct-current power supply 121*c* is connected to the electrode 110 through the switch 122*c* and applies a voltage for electrostatically attracting the wafer W to the electrode 110.

In one or more embodiments of the present application, the central portion of the electrostatic chuck 104 provided with the electrode 110 and the peripheral portion of the electrostatic chuck 104 provided with the electrode 111 are integrated with each other. However, the central portion and the peripheral portion may be separate bodies.

Further, in one or more embodiments of the present application, the electrode 111 for attracting and holding the edge ring E is a bipolar electrode. However, the electrode 111 may be a unipolar electrode.

Further, for example, the central portion of the electrostatic chuck 104 is formed to have a diameter smaller than a diameter of the wafer W. When the wafer W is placed on the upper surface 104*a* of the central portion of the electrostatic chuck 104, a peripheral portion of the wafer W horizontally protrudes outward from the central portion of the electrostatic chuck 104.

Further, the edge ring E has a stepped portion formed on an upper portion thereof, and an upper surface of an outer peripheral portion of the edge ring E is formed to be higher than an upper surface of an inner peripheral portion of the edge ring E. The inner peripheral portion of the edge ring E is positioned below the peripheral portion of the wafer W that horizontally protrudes outward from the central portion of the electrostatic chuck 104. In other words, an inner diameter of the edge ring E is smaller than an outer diameter of the wafer W.

The support 105 is a member formed to have an annular shape in plan view using, for example, an insulating material such as quartz, and is disposed to surround the lower electrode 103 and the electrostatic chuck 104.

A gas discharge hole (not shown) may be formed in the upper surface 104*a* of the central portion of the electrostatic chuck 104 to discharge a heat transfer gas into a gap between a rear surface of the placed wafer W and the wafer W. The heat transfer gas from a gas supply (not shown) is supplied through the gas discharge hole. The gas supply may include one or more gas sources and one or more pressure controllers. In one or more embodiments of the present application, for example, the gas supply is configured to supply the heat transfer gas from the gas source to the gas supply hole through the pressure controller.

Further, as shown in FIG. 5, a gas discharge hole 104*c* is formed in the upper surface 104*b* of the peripheral portion of the electrostatic chuck 104. Specifically, one end of the gas discharge hole 104*c* is open in the upper surface 104*b* of the peripheral portion of the electrostatic chuck 104. For example, a plurality of gas discharge holes 104*c* are provided along a circumferential direction of the electrostatic chuck 104. The gas discharge hole 104*c* supplies the heat transfer gas such as a helium gas to a space between a rear surface of the edge ring E placed on the upper surface 104*b* of the peripheral portion of the electrostatic chuck 104 and the upper surface 104*b*. Further, an end portion of the gas discharge hole 104*c* opposite to the upper surface 104*b* of the peripheral portion is connected to the gas supply 130 through a pipe 133. The gas supply 130 may include one or more gas sources 131 and one or more flow controllers 132. In one or more embodiments of the present application, for example, the gas supply 130 is configured to supply the heat transfer gas from the gas source 131 to the gas discharge hole 104*c* through the flow rate controller 132. Each flow rate controller 132 may include, for example, a mass flow controller or a pressure-controlled flow rate controller. The gas discharge hole 104*c* and the pipe 133 may function as at least a part of a supply path for supplying a gas to the space between the upper surface 104*b* of the peripheral portion of the electrostatic chuck 104, which is the ring placing surface, and the rear surface of the edge ring E.

The end portion of the gas discharge hole 104*c* opposite to the upper surface 104*b* of the peripheral portion is also connected to the exhaust system 160 through a pipe 161. Accordingly, air around the upper surface 104*b* of the peripheral portion of the electrostatic chuck 104 can be exhausted through the gas discharge hole 104*c*. That is, the gas discharge hole 104*c* can function as an exhaust hole for exhausting air around the ring placing surface including the upper surface 104*b* of the peripheral portion of the electrostatic chuck 104. Accordingly, in one or more embodiments of the present application, the gas discharge hole 104*c* and the pipe 161 may function as at least a part of an exhaust path for exhausting air between the upper surface 104*b* of the peripheral portion of the electrostatic chuck 104, which is the ring placing surface, and the rear surface of the edge ring E.

Further, in order to measure a pressure in the gap between the edge ring E electrostatically attracted to the upper surface 104*b* of the peripheral portion and the upper surface 104*b*, a pressure sensor 134 that measures a pressure in the supply path is provided for the electrostatic chuck 104. The pressure sensor 134 is provided in, for example, the pipe 133.

The pipe 133 may also be provided with a switching valve 135 that switches between executing and stopping of supply of the heat transfer gas via the gas supply 130. Similarly, the pipe 161 may be provided with a switching valve 162 that switches between executing and stopping of air exhaustion around the upper surface 104*b* of the peripheral portion with the exhaust system 160.

The insulator 106 in FIG. 3 is a member of a cylindrical shape formed of a ceramic material or the like and supports the support 105. For example, the insulator 106 is formed to have an outer diameter equal to an outer diameter of the support 105 and supports a peripheral edge portion of the support 105.

The lifter 107 is a member that is elevated with respect to the upper surface 104*a* of the central portion of the electrostatic chuck 104. The lifter 107 is formed to have a columnar shape using, for example, a ceramic material. When the lifter 107 is raised, an upper end thereof protrudes from the upper surface 104*a* and can support the wafer W. The lifter 107 can transfer the wafer W between the wafer support 101 and the transfer arm 71 of the transfer robot 70.

Three or more lifters 107 are provided at intervals from each other and are provided to extend in an up-down direction.

The lifter 107 is elevated by an actuator 112. The actuator 112 includes, for example, a support member 113 that supports a plurality of lifters 107, and a driving unit 114 that generates a driving force for elevating the support member 113 to elevate the plurality of lifters 107. The driving unit

114 includes, for example, a motor (not shown) as a driving source that generates the driving force.

The lifter 107 is inserted into an insertion hole 115 having an upper end open to the upper surface 104*a* of the central portion of the electrostatic chuck 104. For example, the insertion hole 115 is formed to extend downward from the upper surface 104*a* of the central portion of the electrostatic chuck 104 to reach a bottom surface of the lower electrode 103.

The lifter 108 is an elevation member that is elevated with respect to the upper surface 104*b* of the peripheral portion of the electrostatic chuck 104, and is formed of, for example, a ceramic material. For example, the lifter 108 is formed to have a columnar shape except for its upper end portion (that is, a tip), and the upper end portion is formed to have a hemispherical shape. In one or more embodiments of the present application, the lifter 108 is configured such that an upper end thereof can protrude from an upper surface 105*a* of the support 105 when the lifter 108 is raised.

Three or more lifters 108 are provided at intervals from each other along the circumferential direction of the electrostatic chuck 104 and are provided to extend in the up-down direction.

The lifter 108 is elevated by an actuator 116. For example, the actuator 116 is provided for each lifter 108 and includes a support member 117 that movably supports the lifter 108 in the horizontal direction. For example, the support member 117 has a thrust bearing in order to movably support the lifter 108 in the horizontal direction. The actuator 116 also includes a driving unit 118 that generates a driving force for elevating the support member 117 to elevate the lifter 108. The driving unit 118 includes, for example, a motor (not shown) as a driving source that generates the driving force.

In one or more embodiments of the present application, the lifter 108 is inserted into an insertion hole 119 having an upper end open to the upper surface 105*a* of the support 105. For example, the insertion hole 119 is formed to pass through the support 105 in the up-down direction.

The edge ring E can be transferred between the wafer support 101 and the transfer arm 71 of the transfer robot 70 by the lifter 108.

Further, the lifter 108 and the actuator 116 constitute an elevation mechanism that elevates the edge ring E with respect to the ring placing surface.

The upper electrode 102 also functions as a gas supply, that is, a shower head, that discharges one or more gases from the gas supply 140 into the chamber 100. In one or more embodiments of the present application, the upper electrode 102 has a gas inlet 102*a*, a gas diffusion space 102*b*, and a plurality of gas outlets 102*c*. For example, the gas inlet 102*a* is in fluid communication with the gas supply 140 and the gas diffusion space 102*b*. The plurality of gas outlets 102*c* are in fluid communication with inner spaces of the gas diffusion space 102*b* and the chamber 100. In one or more embodiments of the present application, the upper electrode 102 is configured to supply one or more gases such as processing gases from the gas inlet 102*a* to the chamber 100 through the gas diffusion space 102*b* and the plurality of gas outlets 102*c*.

The gas supply 140 may include one or more gas sources 141 and one or more flow rate controllers 142. In one or more embodiments of the present application, for example, the gas supply 140 is configured to supply one or more gases from the respective corresponding gas sources 141 to the gas inlet 102*a* through the respective corresponding flow rate controllers 142. Each flow rate controller 142 may include, for example, a mass flow controller or a pressure-controlled flow rate controller. Further, the gas supply 140 may include one or more flow rate modulation devices that modulate or pulsate flow rates of one or more gases.

The RF power supply 150 is configured to supply an RF power, for example, one or more RF signals, to one or more electrodes such as the lower electrode 103, the upper electrode 102, or both the lower electrode 103 and the upper electrode 102. Accordingly, the plasma is generated from one or more processing gases supplied into the chamber 100, that is, the processing space 100*s*. Accordingly, the RF power supply 150 may function as at least a part of a plasma generator that generates the plasma in the chamber 100. Specifically, the plasma generator is configured to generate the plasma from one or more gases in the chamber 100. For example, the RF power supply 150 includes two RF generators 151*a* and 151*b* and two matching circuits 152*a* and 152*b*. In one or more embodiments of the present application, the RF power supply 150 is configured to supply a first RF signal from the first RF generator 151*a* to the lower electrode 103 through the first matching circuit 152*a*. For example, the first RF signal may have a frequency within a range of 27 MHz to 100 MHz.

Further, in one or more embodiments of the present application, the RF power supply 150 is configured to supply a second RF signal from the second RF generator 151*b* to the lower electrode 103 through the second matching circuit 152*b*. For example, the second RF signal may have a frequency within a range of 400 kHz to 13.56 MHz. Further, instead of the second RF generator 151*b*, a Direct Current (DC) pulse generator may be used.

Although it is not illustrated, other embodiments may be considered in the present disclosure. For example, in an alternative embodiment, the RF power supply 150 may be configured to supply the first RF signal from the RF generator to the lower electrode 103, supply the second RF signal from another RF generator to the lower electrode 103, and supply a third RF signal from still another RF generator to the lower electrode 103. In addition, in another alternative embodiment, a DC voltage may be applied to the upper electrode 102.

Further, in various embodiments, amplitudes of one or more RF signals (that is, the first RF signal, the second RF signal, and the like) may be pulsated or modulated. The amplitude modulation may include pulsating the RF signal amplitude between an ON state and an OFF state, or between two or more different ON states.

The exhaust system 160 may be connected to an exhaust port 100*e* provided, for example, at a bottom of the chamber 100. The exhaust system 160 may include a pressure valve and a vacuum pump. The vacuum pump may include a turbo molecular pump, a roughing pump or a combination thereof.

Next, an example of the wafer processing performed by the processing module 60 will be described. In the processing module 60, the wafer W is subjected to the plasma processing such as the etching processing.

The wafer W is first loaded into the chamber 100 by the transfer robot 70, and the wafer W is placed on the electrostatic chuck 104 by raising/elevating and lowering the lifter 107. A direct-current voltage is then applied from the direct-current power supply 121*c* to the electrode 110 of the electrostatic chuck 104 that thus electrostatically attracts and holds the wafer W. After the wafer W is loaded, the inner space of the chamber 100 is decompressed to a predetermined vacuum level by the exhaust system 160.

The processing gas is subsequently supplied from the gas supply 140 to the processing space 100*s* through the upper electrode 102. Further, RF power HF for plasma generation is supplied from the RF power supply 150 to the lower electrode 103 to excite the processing gas to generate plasma. RF power LF for ion attraction may also be supplied from The RF power supply 150. With the generated plasma, the wafer W is subjected to the plasma processing.

During the plasma processing, direct-current voltages are applied from the direct-current power supplies 121*a* and 121*b* to the electrode 111 of the electrostatic chuck 104. Accordingly, the edge ring E is electrostatically attracted and held by the electrostatic chuck 104. Further, during the plasma processing, the heat transfer gas is supplied, via the gas supply or the like, toward bottom surfaces of the wafer W and the edge ring E attracted and held by the electrostatic chuck 104.

To end the plasma processing, the supply of the RF power HF from the RF power supply 150 and the supply of the processing gas from the gas supply 140 are stopped. When the RF power LF is supplied during the plasma processing, the supply of the RF power LF is also stopped. Subsequently, the attracting and holding the wafer W by the electrostatic chuck 104 is stopped. The supply of the heat transfer gas to the bottom surface of the wafer W may also be stopped.

Then, the wafer W is raised by the lifter 107 and separated from the electrostatic chuck 104. During the separation, charge neutralization of the wafer W may be performed. The wafer W is unloaded from the chamber 100 by the transfer robot 70, and a series of wafer processing ends.

Example 1 of Installation Sequence

Figure 6:
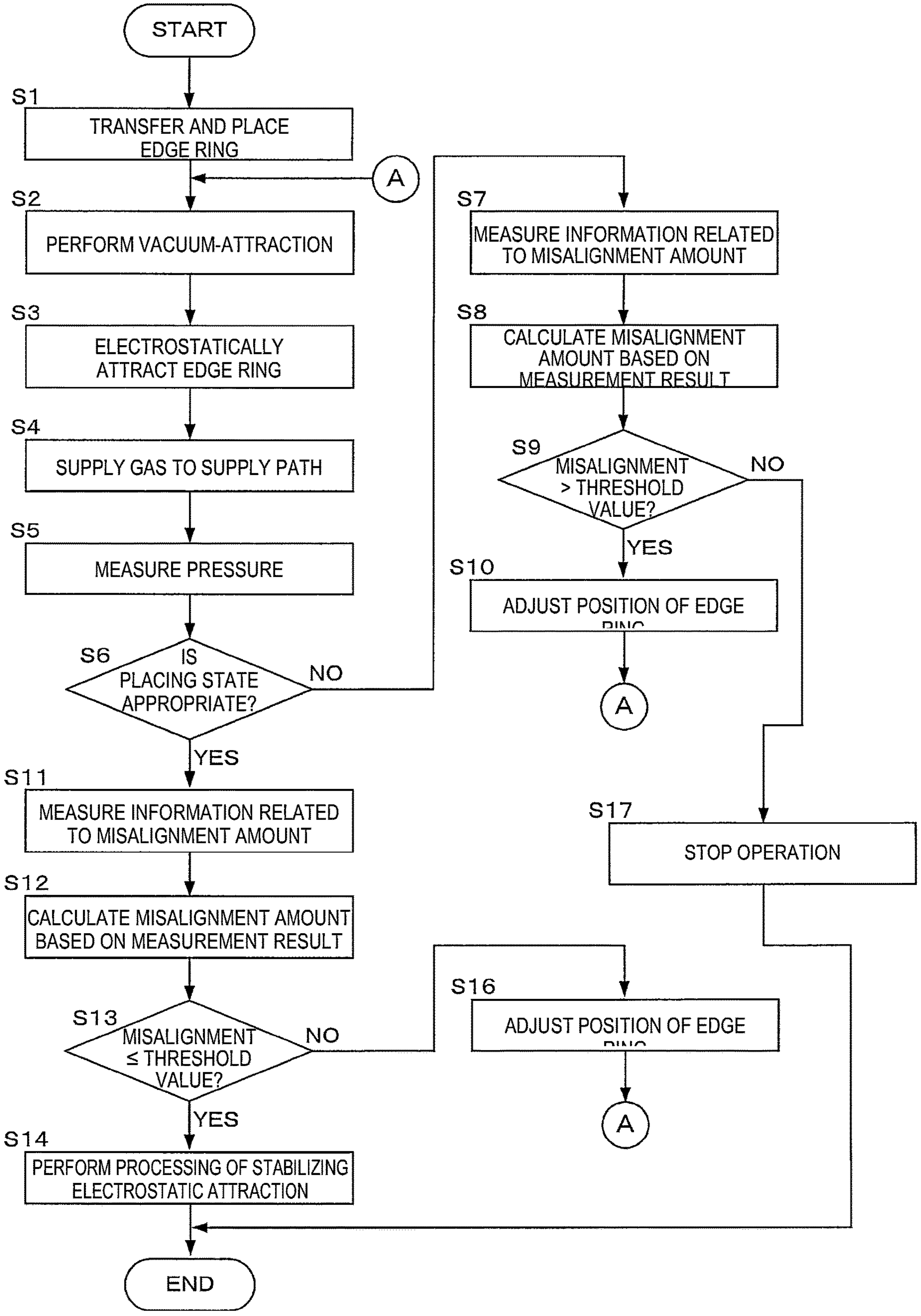
FIG. 6 is a flowchart showing Example 1 of an installation sequence of an edge ring.

Next, an example of an installation sequence of the edge ring E in the processing module 60 executed by the plasma processing system 1 will be described. FIG. 6 is a flowchart showing Example 1 of the installation sequence of the edge ring E. FIGS. 7 to 14 are diagrams schematically showing the state of the processing module 60 when the installation sequence of the edge ring E is executed. In FIGS. 7 to 14, a valve in an open state and the voltage application unit 120 in the ON state are shown in white, a valve in a closed state and the voltage application unit 120 in the OFF state are shown in black, and a pipe in which the gas flows is shown by a thick line. Further, in FIGS. 7 to 14, the gas discharge hole 104*c* through which gas has been exhausted is shown in black, the gas discharge hole 104*c* in which the heat transfer gas is present is shown in gray, and the gas discharge hole 104*c* in other states is shown in white. Each of the following steps is performed by the plasma processing system 1 under control and calculation of the controller 80 (specifically, the processor 91) based on the program stored in the storage 92.

For example, as shown in FIG. 6, first, the edge ring E that is transferred into the chamber 100 by the transfer robot 70 and that is transferred to the elevation mechanism including the lifter 108 is lowered by the elevation mechanism and placed on the ring placement surface (step S1). Step S1 is performed without the wafer W in the chamber 100.

Specifically, in step S1, for example, the transfer robot 70 first loads the edge ring E in the accommodation module 61 into the chamber 100 of the processing module 60 that is an processing target of the edge ring E.

Figure 7:
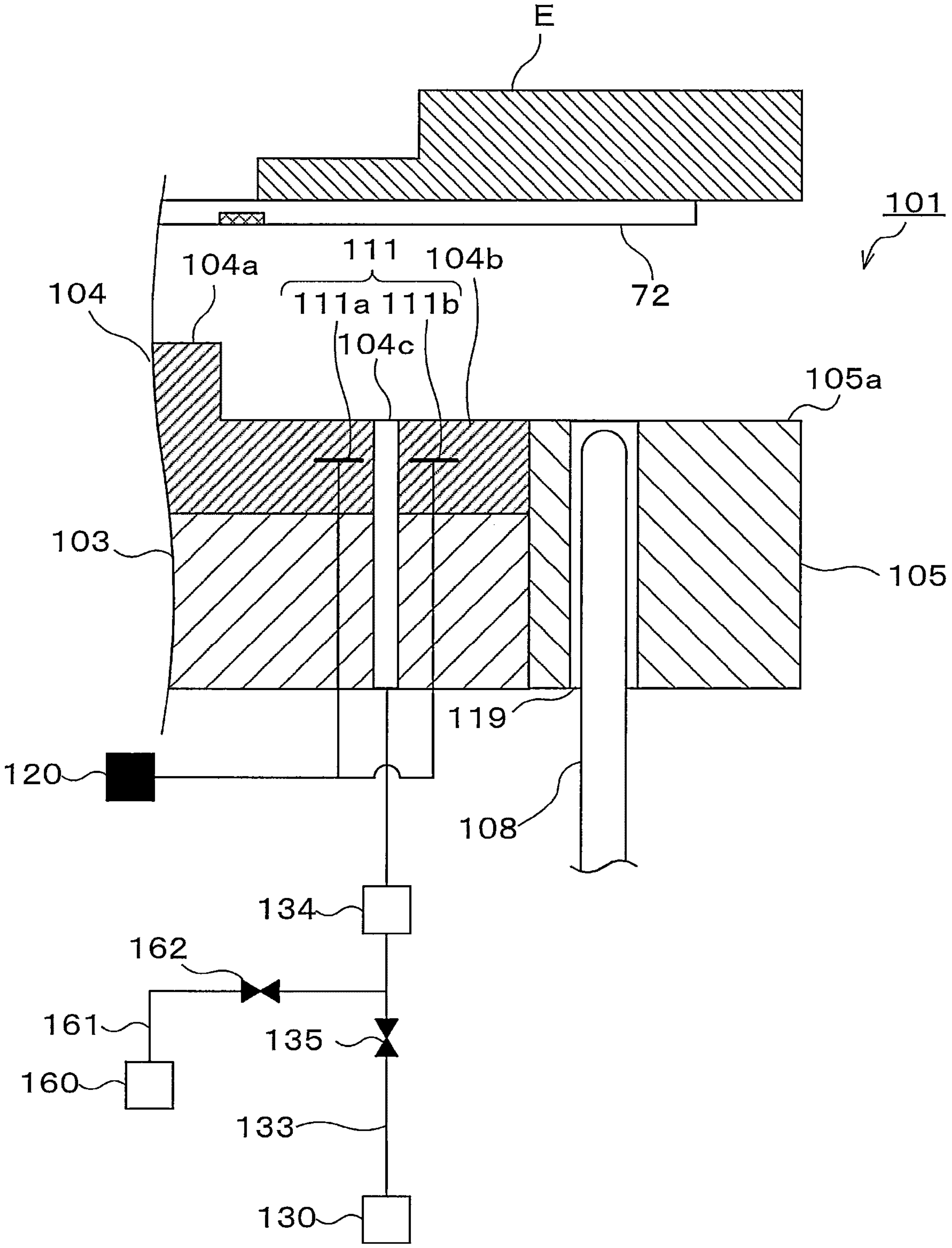
FIG. 7 is a diagram schematically showing a state of the processing module when the installation sequence of the edge ring is executed.

More specifically, for example, the edge ring E in the accommodation module 61 is held by the fork 72 of the transfer arm 71 of the transfer robot 70. Further, in the processing module 60 that is the installation target, the exhaust system 160 exhausts air in the chamber 100 in a state where the gas is not discharged through the upper electrode 102 to create a high vacuum in the chamber 100. Next, the corresponding gate valve 62 is open, and the fork 72 holding the edge ring E is inserted into the chamber 100 through a loading and unloading port (not shown). As shown in FIG. 7, the edge ring E is transferred above the upper surface 104*b* of the peripheral portion of the electrostatic chuck 104 and the upper surface 105*a* of the support 105 by the fork 72. At this time, the wafer W is not placed on the upper surface 104*a* of the central portion of the electrostatic chuck 104.

Subsequently, the edge ring E is transferred from the transfer robot 70 to the lifter 108.

Figure 8:
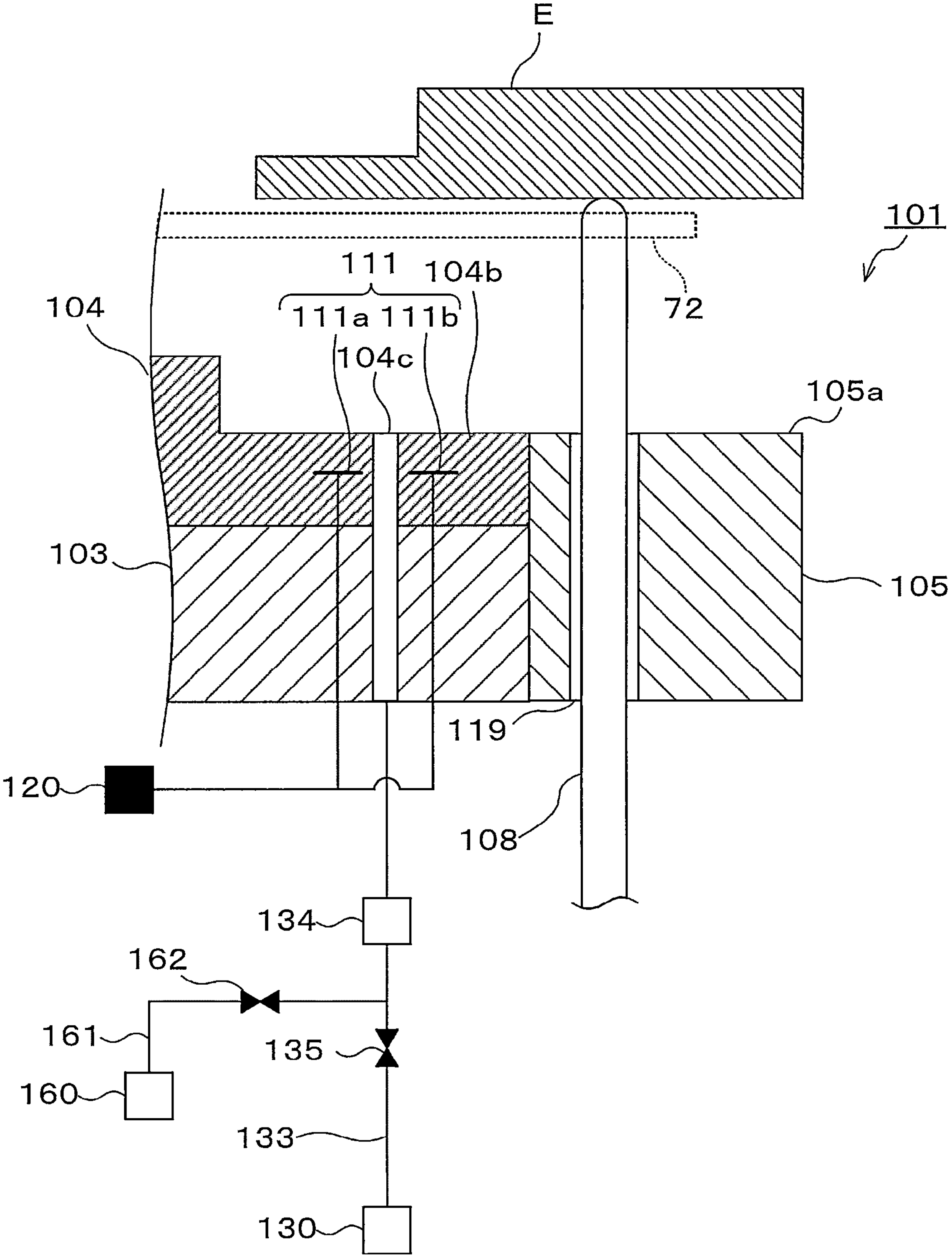
FIG. 8 is a diagram schematically showing the state of the processing module when the installation sequence of the edge ring is executed.

Specifically, all lifters 108 are raised, and the edge ring E is transferred from the fork 72 to the lifter 108 as shown in FIG. 8. Then, the fork 72 is retracted from the chamber 100, and the gate valve 62 is closed.

Next, the edge ring E is lowered by the elevation mechanism including the lifter 108 and placed on the upper surface 104*b* of the peripheral portion of the electrostatic chuck 104, which is the ring placing surface.

Figure 9:
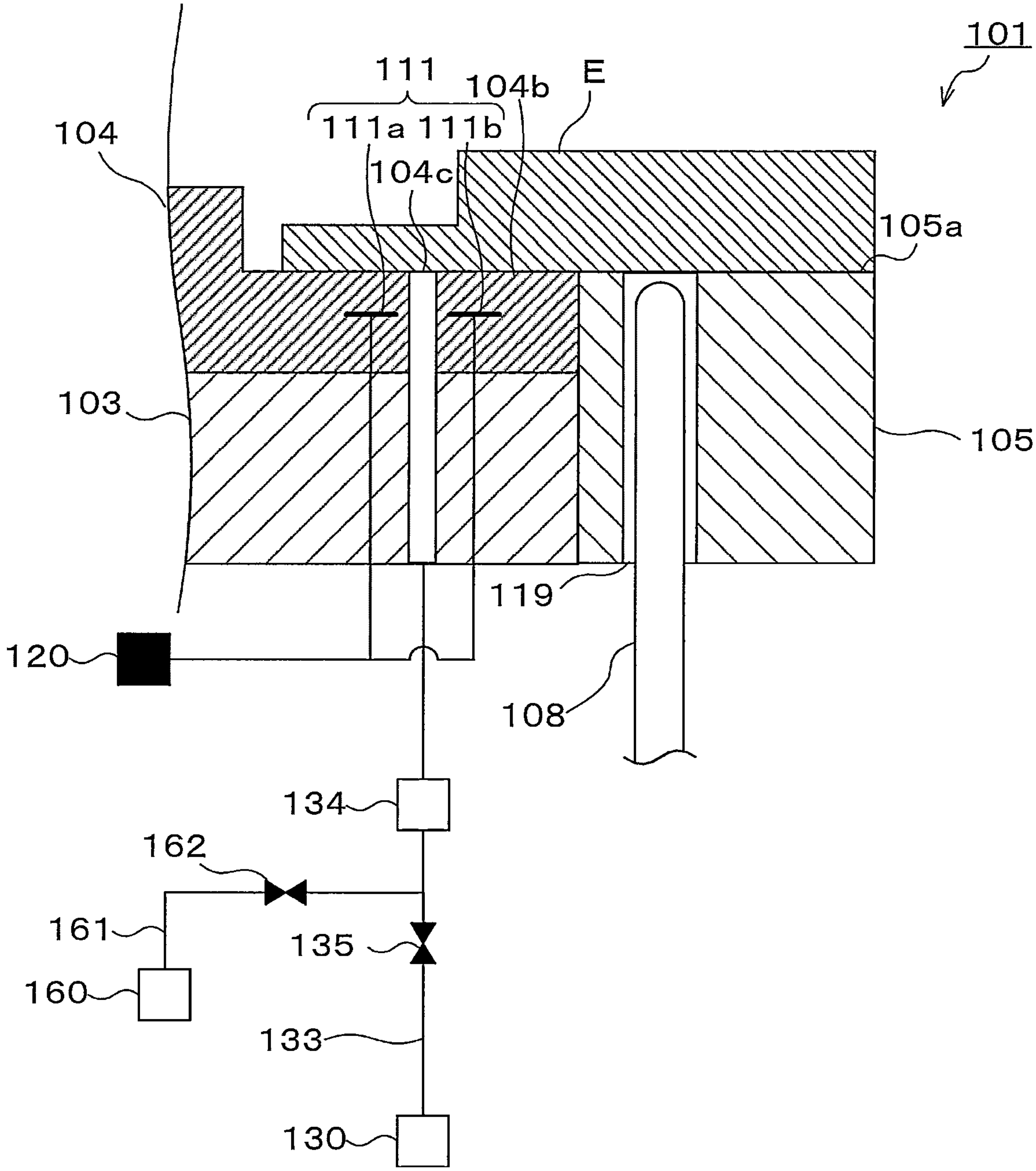
FIG. 9 is a diagram schematically showing the state of the processing module when the installation sequence of the edge ring is executed.

Specifically, the lifter 108 is lowered until the upper end of the lifter 108 is accommodated in the insertion hole 119. Accordingly, as shown in FIG. 9, the edge ring E is placed on the upper surface 104*b* of the peripheral portion of the electrostatic chuck 104, which is the ring placing surface.

After step S1, the edge ring E is vacuum-attracted to the ring placing surface (step S2). Specifically, without the wafer W in the chamber 100, air around the ring placing surface is exhausted through the gas supply hole 104*c* that also functions as the exhaust hole.

Figure 10:
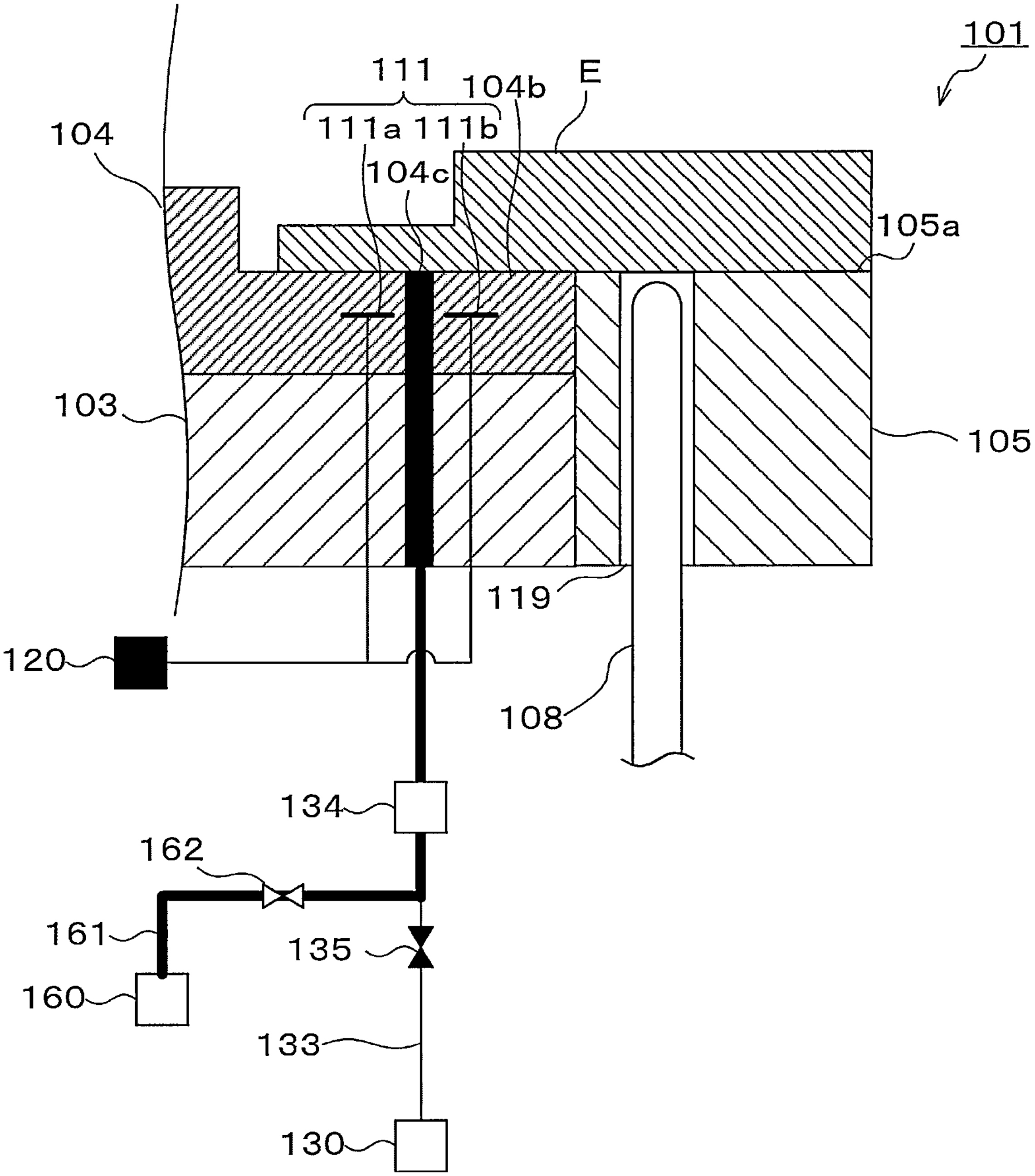
FIG. 10 is a diagram schematically showing the state of the processing module when the installation sequence of the edge ring is executed.

More specifically, as shown in FIG. 10, the switching valve 162 switches to the open state, and air around the upper surface 104*b* of the peripheral portion of the electrostatic chuck 104 and the upper surface 105*a* of the support 105 is exhausted through the gas discharge hole 104*c* by the exhaust system 160. In particular, air near the upper surface 104*b* of the peripheral portion of the electrostatic chuck 104 is exhausted through the gas discharge hole 104*c*. Accordingly, the edge ring E is vacuum-attracted to the upper surface 104*b* of the peripheral portion of the electrostatic chuck 104, which is the ring placing surface.

Next, the placed edge ring E is electrostatically attracted to the ring placing surface (step S3). Specifically, a voltage is applied to the electrode 111 of the electrostatic chuck 104 without the wafer W in the chamber 100, the edge ring E is placed on the ring placing surface, and air is being exhausted through the gas discharge hole 104*c*.

Figure 11:
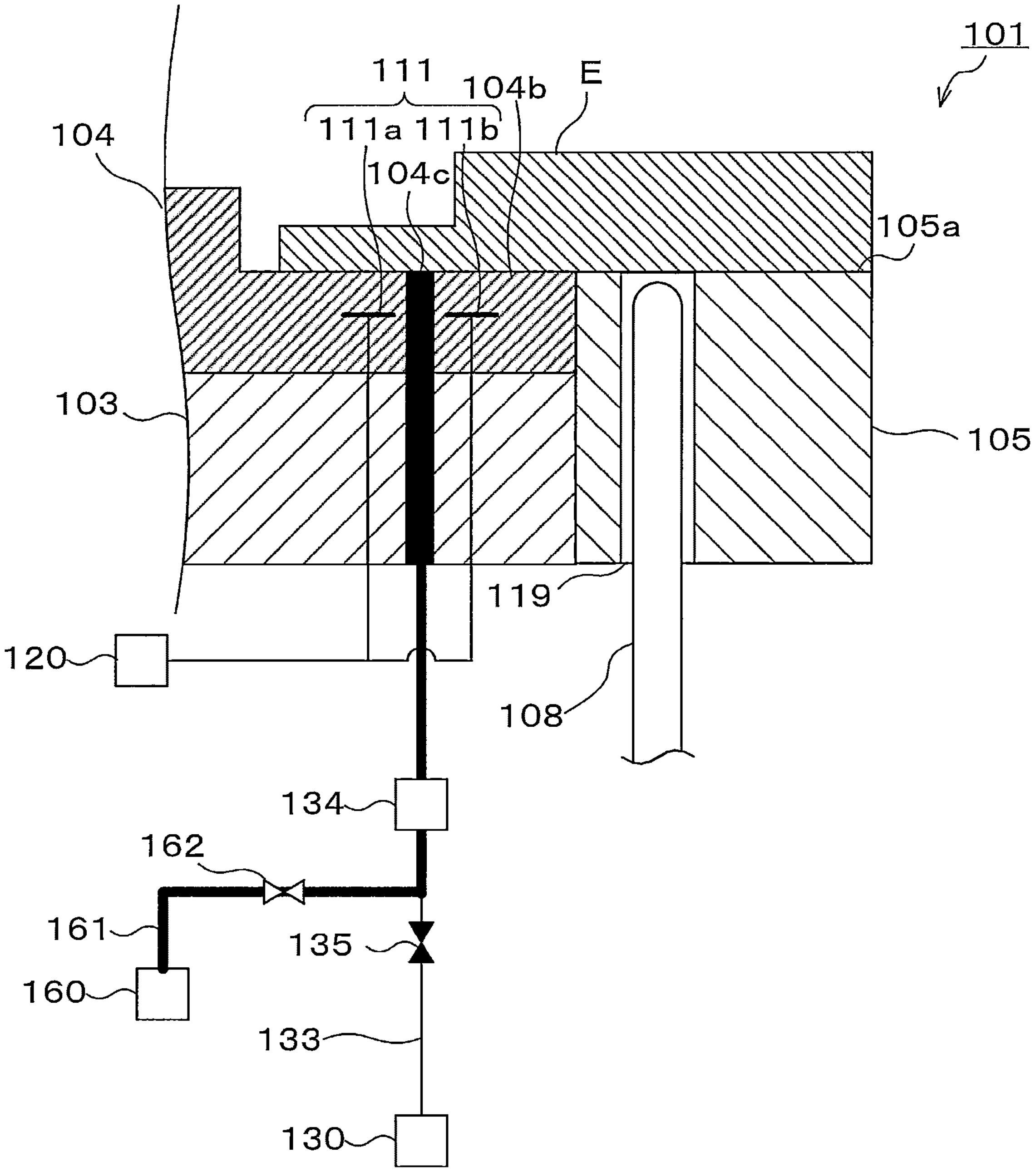
FIG. 11 is a diagram schematically showing the state of the processing module when the installation sequence of the edge ring is executed.

More specifically, as shown in FIG. 11, with the edge ring E placed on the upper surface 104*b* of the peripheral portion of the electrostatic chuck 104, which is the ring placing surface, and air being exhausted through the gas discharge hole 104*c*, the voltage application unit 120 switches to the ON state. Specifically, the direct-current power supplies 121*a* and 121*b* switch to the ON state. Accordingly, a direct-current voltage is applied to the electrode 111 of the electrostatic chuck 104. For example, direct-current voltages having polarities different from each other are applied to the electrodes 111*a* and 111*b*.

A voltage may be applied to the electrode 111 of the electrostatic chuck 104 after gas is exhausted through the gas supply hole 104*c* and gas exhaustion is completed and stopped.

Next, the gas is supplied to the supply path such that the pressure in the supply path including the gas discharge hole 104*c* is maintained to be higher than a pressure in the chamber 100 (step S4).

Specifically, without the wafer W in the chamber 100, the gas exhaustion through the gas discharge hole 104*c* is stopped, and a predetermined gas is discharged to the gap between the ring placing surface and the edge ring E through the gas discharge hole 104*c*. The pressure in the gap is increased above the pressure in the chamber 100.

At the end of step S4, the gas supply to the supply path, that is, the discharge of the predetermined gas through the gas discharge hole 104*c*, is stopped.

Figure 12:
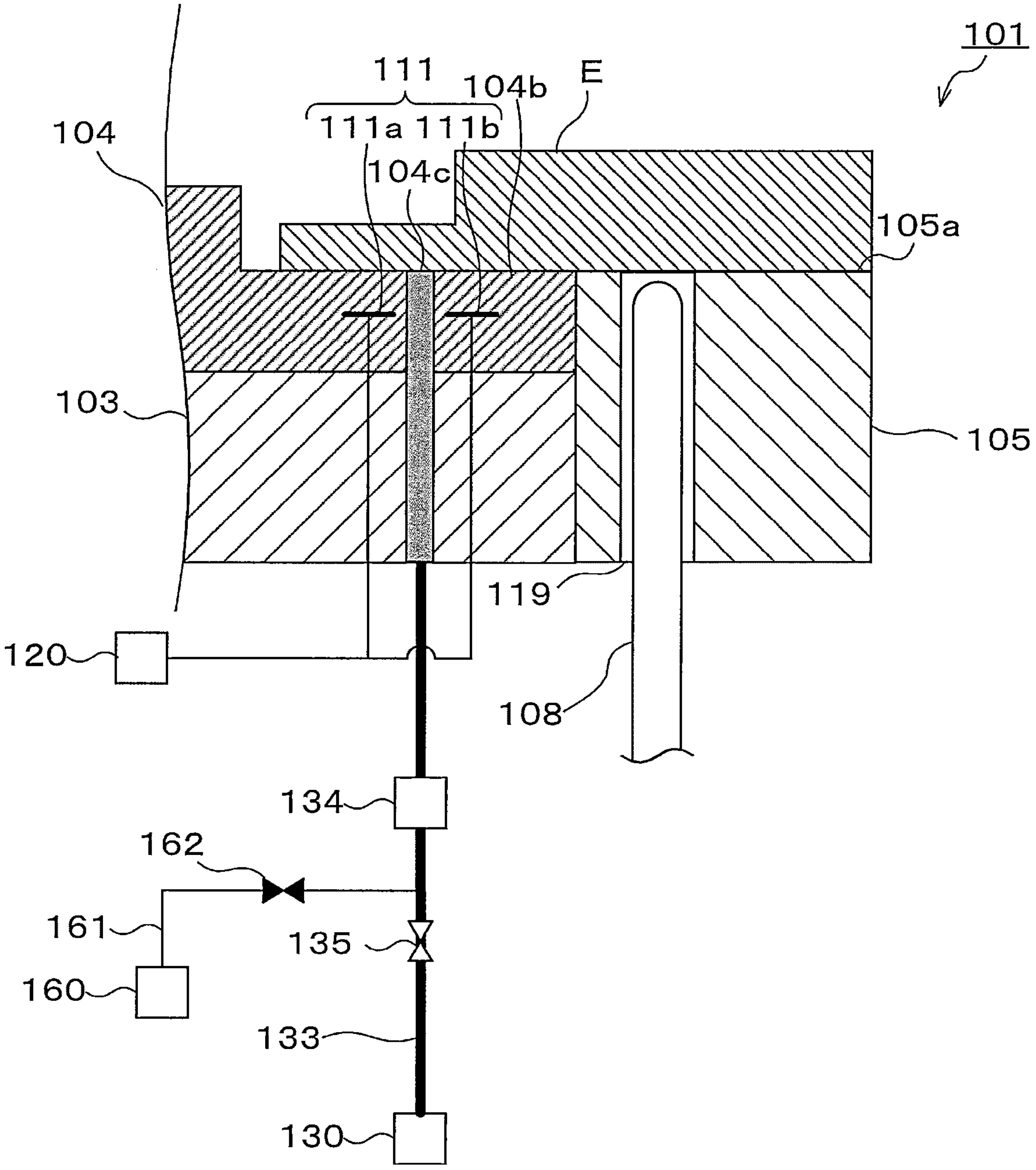
FIG. 12 is a diagram schematically showing the state of the processing module when the installation sequence of the edge ring is executed.
Figure 13:
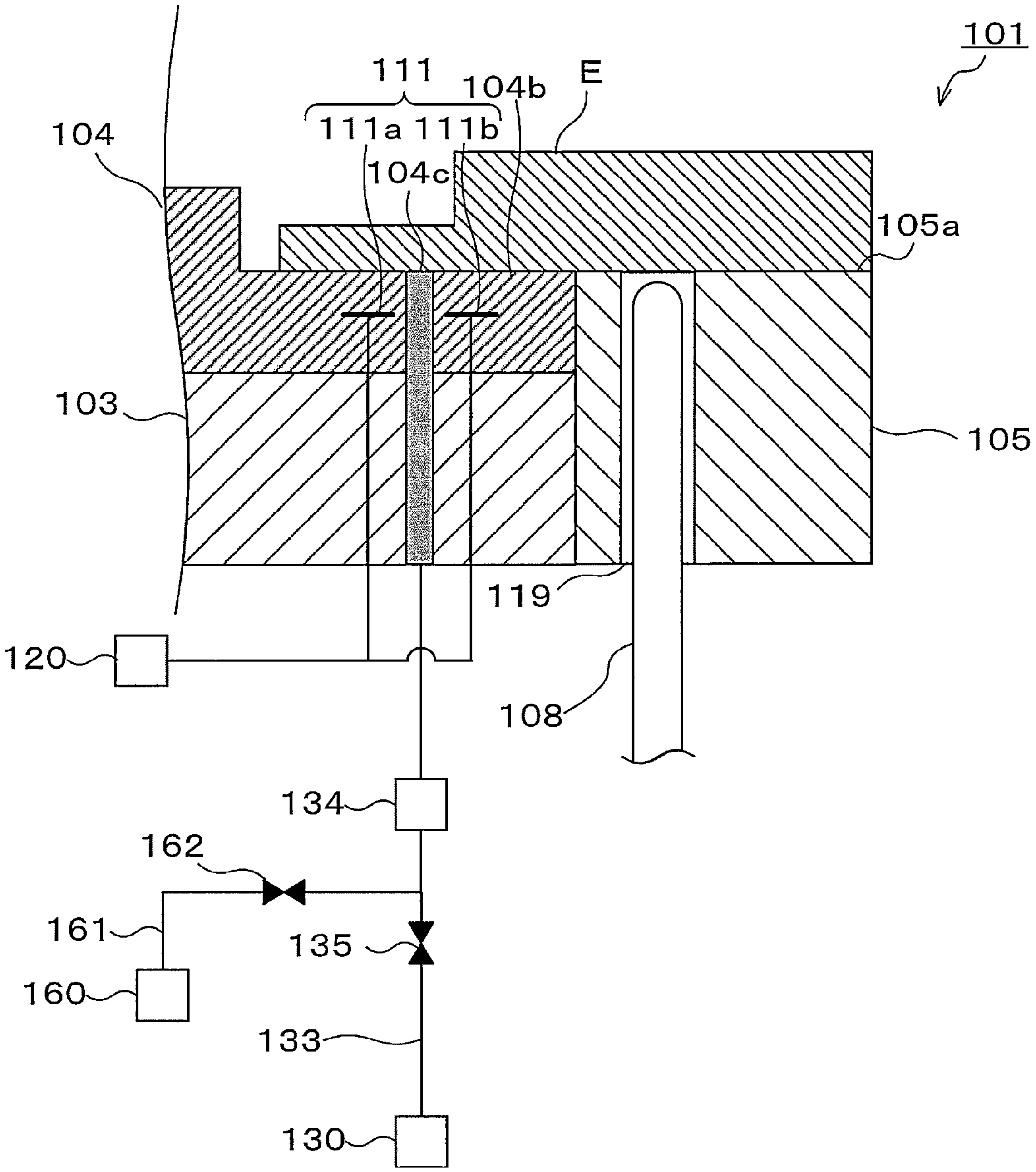
FIG. 13 is a diagram schematically showing the state of the processing module when the installation sequence of the edge ring is executed.
Figure 14:
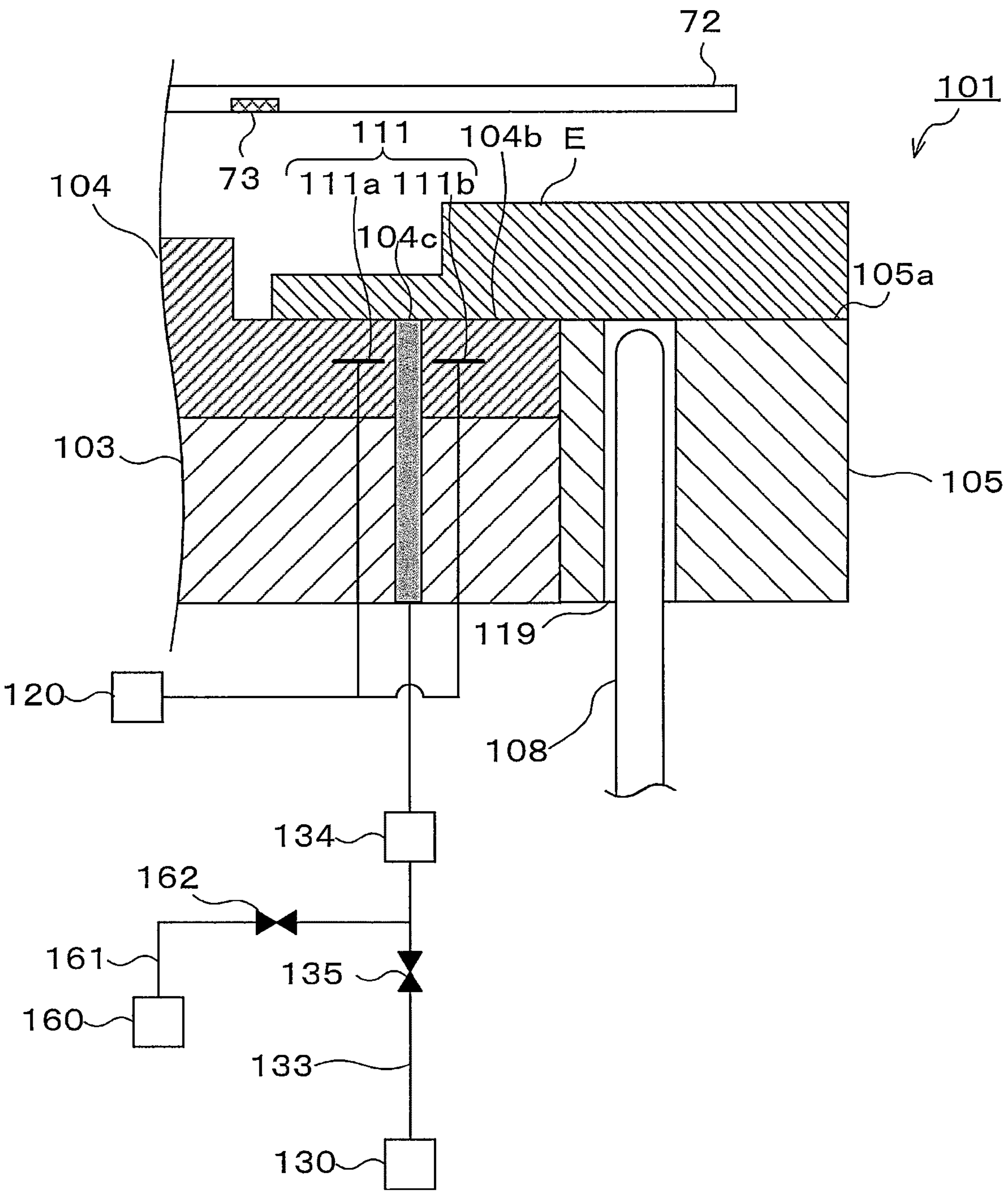
FIG. 14 is a diagram schematically showing the state of the processing module when the installation sequence of the edge ring is executed.

In step S4, more specifically, as shown in FIG. 12, the switching valve 162 switches to the closed state, and the air exhaustion by the exhaust system 160 through the gas discharge hole 104*c* is stopped. Further, the switching valve 135 switches to the open state, and the heat transfer gas supplied from the gas supply 130 is discharged to the gap through the gas discharge hole 104*c*. When the pressure in the gap reaches a target pressure (specifically, for example, when a measurement result of the pressure sensor 134 reaches the target pressure), the switching valve 135 switches to the closed state as shown in FIG. 13, and the discharge of the heat transfer gas is stopped. The target pressure is, for example, the pressure in the gap during the plasma processing.

After the gas supply in step S4, the pressure in the supply path including the gas discharge hole 104*c* is measured (step S5).

Specifically, in step S5, a pressure in the pipe 133 (more specifically, a pressure downstream of the switching valve 135 in the pipe 133) is measured by the pressure sensor 134 after a predetermined time elapses from the stopping of the gas supply in step S4. The predetermined time is, for example, 10 seconds to 100 seconds, and this information is stored in advance in the storage 92.

The pressure downstream of the switching valve 135 in the pipe 133 substantially coincides with the pressure in the gap between the ring placing surface and the edge ring E. Accordingly, step S5 can be referred to as a step of measuring the pressure in the gap between the ring placing surface and the edge ring E.

The controller 80 determines a placing state of the edge ring E on the ring placing surface, that is, whether the placing state is appropriate, based on the measurement result in step S5 (step S6).

Specifically, the controller 80 determines leaking of the predetermined gas from the gap based on the measurement result in step S5. More specifically, the controller 80 determines whether the pressure measured in step S5 is less than a threshold as the determination of leaking of the predetermined gas from the gap. This threshold is set to, for example, 90 to 98% of the target pressure, and this information is stored in advance in the storage 92.

When the placement state of the edge ring E on the ring placing surface is determine to be inappropriate in step S6, that is, when the predetermined gas is determined to have leaked from the gap (NO), the measurer 73 of the transfer robot 70 measures information relating to the misalignment amount of the edge ring E with respect to the electrostatic chuck 104 (step S7).

Specifically, when the predetermined gas is determined to have leaked from the gap, that is, when the pressure measured in step S5 is less than the threshold, first, the gate valve 62 is open, and the fork 72 that is not holding the wafer W and the edge ring E is inserted into the chamber 100. A distance from the distance sensor to the wafer support 101 is measured by the distance sensor included in the measurer 73 for each predetermined interval in the circumferential direction of the electrostatic chuck 104 and for each predetermined fine interval in a diameter direction of the electrostatic chuck 104.

Then, the controller 80 calculates the misalignment amount of the edge ring E with respect to the electrostatic chuck 104 based on the measurement result of the measurer 73 (step S8).

Specifically, the controller 80 identifies a peripheral end of the central portion of the electrostatic chuck 104 and an inner peripheral end of the edge ring E for each predetermined interval related to the circumferential direction of the electrostatic chuck 104 based on the measurement result in step S7, and calculates a distance from the peripheral end of the central portion of the electrostatic chuck 104 to the inner peripheral end of the edge ring E. The controller 80 calculates the misalignment amount of the edge ring E with respect to the electrostatic chuck 104 (specifically, a distance from the center of the central portion of the electrostatic chuck 104 to the center of the edge ring E) based on a calculation result for each predetermined interval. The misalignment amount calculated here includes a direction of the misalignment.

Next, the controller 80 determines whether the misalignment amount calculated in step S8 exceeds a threshold (step S9). This threshold is, for example, 200 μm, and this information is prestored in the storage 92.

When a determination that the misalignment amount exceeds the threshold is made in step S9 (YES), the position of the edge ring E on the ring placing surface is adjusted (step S10).

Specifically, the application of the voltage to the electrode 111 of the electrostatic chuck 104 is stopped, and the edge ring E is raised by the elevation mechanism including the lifter 108. Then, the edge ring E is transferred to the transfer robot 70.

More specifically, the application of the direct-current voltage from the voltage application unit 120 to the electrode 111 is stopped, and the fork 72 of the transfer robot 70 is retracted from a position above the wafer support 101. Next, charge neutralization of the edge ring E is performed. Then, all the lifters 108 are raised, and the edge ring E is transferred from the wafer support 101 to the lifter 108. Next, the fork 72 of the transfer arm 71 is moved to a position between the wafer support 101 and the edge ring E supported by the lifter 108. Next, all the lifters 108 are lowered, and the edge ring E is transferred from the lifter 108 to the fork 72.

Then, the edge ring E is moved to a position based on the misalignment amount calculated in step S8.

Specifically, the fork 72 is moved to a corrected position based on the misalignment amount calculated in step S8. The corrected position is calculated in advance by the controller 80 based on the misalignment amount calculated in step S8, such that the misalignment amount approaches zero.

Then, after the edge ring E is returned to the elevation mechanism including the lifter 108, the edge ring E is lowered by the elevation mechanism and placed on the ring placing surface again.

Specifically, all the lifters 108 are raised again, and the edge ring E is transferred from the fork 72 to the lifter 108. Next, the fork 72 is retracted from the chamber 100, and the gate valve 62 is closed.

Then, the edge ring E is lowered by the elevation mechanism including the lifter 108 and placed on the upper surface 104*b* of the peripheral portion of the electrostatic chuck 104, which is the ring placing surface.

Specifically, the lifter 108 is lowered until the upper end of the lifter 108 is accommodated in the insertion hole 119. Accordingly, the edge ring E is placed on the upper surface 104*b* of the peripheral portion of the electrostatic chuck 104, which is the ring placing surface.

After step S10, the sequence returns to step S2, and the vacuum-attraction or the like of the edge ring E is performed.

When a determination that the placing state of the edge ring E on the ring placing surface is appropriate is made in step S6, that is, when a determination that leaking of the predetermined gas from the gap does not occur is made (specifically, when the pressure in the gap measured in step S5 is greater than or equal to the threshold) (YES), step S11 similar to step S7 is performed. Accordingly, the measurer 73 measures the information relating to the misalignment amount of the edge ring E with respect to the electrostatic chuck 104.

Then, as in step S8, the controller 80 calculates the misalignment amount of the edge ring E with respect to the electrostatic chuck 104 based on the measurement result of the measurer 73 (step S12).

Next, the controller 80 determines whether the misalignment amount calculated in step S12 is less than or equal to the threshold (step S13).

When a determination that the misalignment amount is less than or equal to the threshold is made in step S13 (YES), processing of stabilizing the electrostatic attraction of the edge ring E is performed (step S14).

Specifically, for example, an electrostatic attraction force of the edge ring E is increased by generating the plasma from the processing gas in the chamber 100 and changing a charging state of the edge ring E using the plasma.

This completes the sequence.

Meanwhile, when a determination that the misalignment amount exceeds the threshold is made in step S13 (NO), the position of the edge ring E on the ring placing surface is adjusted without the wafer W in the chamber 100, as in step S10 (step S16).

After step S16, the sequence returns to step S2, and the vacuum-attraction or the like of the edge ring E is performed.

When a determination that the misalignment amount does not exceed the threshold is made in step S9 (NO), damage to at least either the edge ring E or the electrostatic chuck 104, clinging of a foreign object to the upper surface 104*b* of the peripheral portion of the electrostatic chuck 104, and the like are expected. Thus, the operation of the entirety or a part (for example, only the corresponding processing module 60) of the plasma processing system 1 is stopped (step S17). Then, the sequence ends. At the end, an alarm may be sounded, or the worker may be notified.

When a determination that the misalignment amount does not exceed the threshold is made in step S9 (NO), the edge ring E may be temporarily removed from the wafer support 101 and then placed on the wafer support 101 again. Then, the steps from step S2 may be repeated. Further, after the edge ring E is unloaded from the chamber 100, the steps from step S1 may be performed for a new edge ring E.

Example 2 of Installation Sequence

In Example 1 of the installation sequence, step S2 is performed after step S1. However, step S2 may be performed in parallel with step S1.

Specifically, after the edge ring E is transferred to the lifter 108 in step S1, gas around the ring placing surface may be exhausted through the gas discharge hole 104*c*, which also functions as the exhaust hole, in step S2 before the edge ring E is lowered and placed on the ring placing surface.

Example 3 of Installation Sequence

Figure 15:
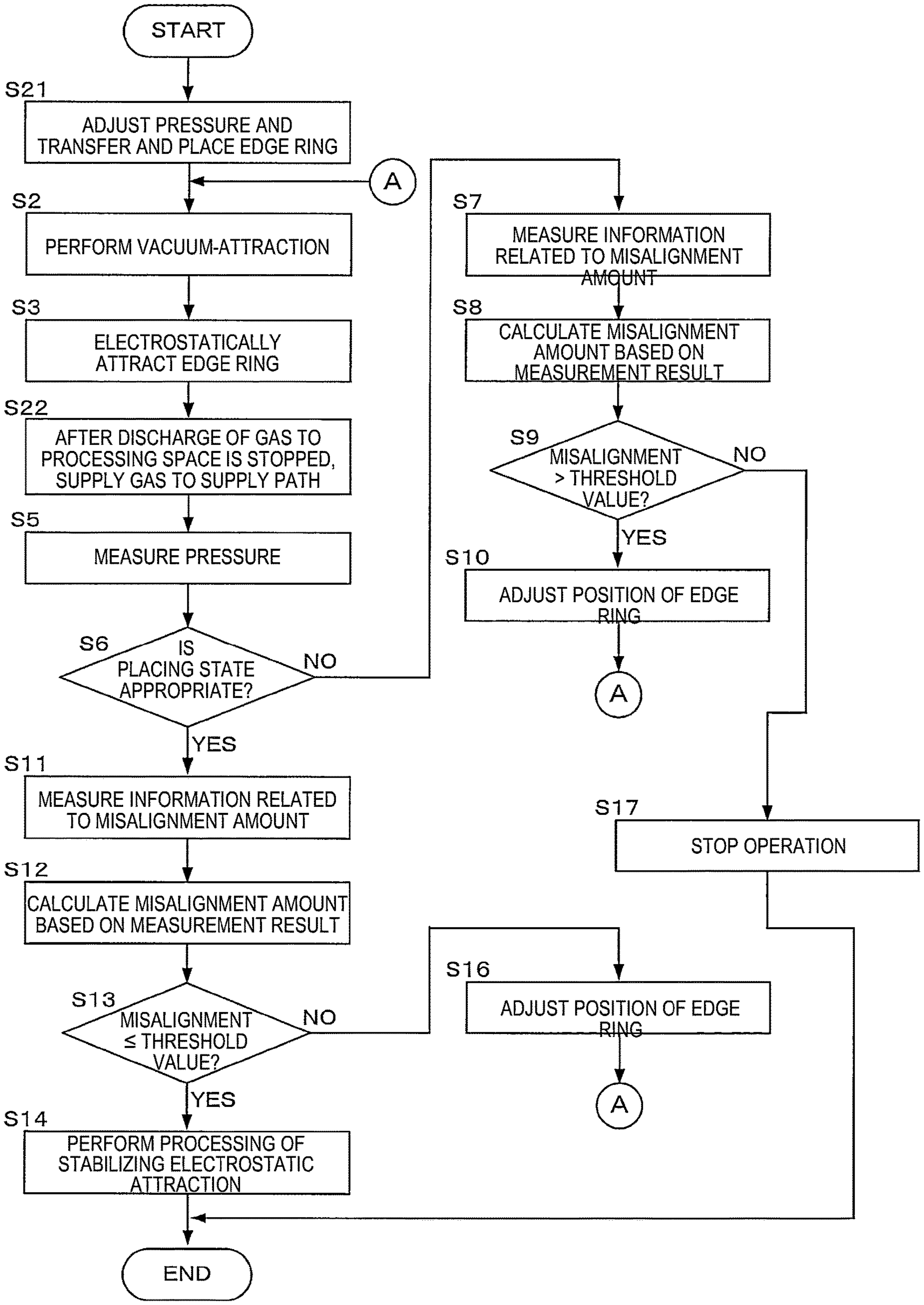
FIG. 15 is a flowchart showing Example 3 of the installation sequence of the edge ring.

FIG. 15 is a flowchart showing Example 3 of the installation sequence of the edge ring E.

In Example 1 of the installation sequence, in step S1, the exhaust system 160 exhausts air in the chamber 100 in a state where the gas is not discharged through the upper electrode 102, and in a state where a high vacuum is formed in the chamber 100, the edge ring E is transferred into the chamber 100, and the edge ring E is placed on the ring placing surface.

Meanwhile, in the present example, step S21 described below is performed instead of step S1 as shown in FIG. 15. In step S21, the gas is discharged into the processing space 100*s* through the upper electrode 102, and air in the chamber 100 is exhausted by the exhaust system 160. In a state where a quasi-high vacuum (for example, several hundred mTorr) is formed in the chamber 100, the edge ring E is transferred into the chamber 100, and the edge ring E is placed on the ring placing surface.

The gas may be discharged into the processing space 100*s* through the upper electrode 102 as described above, or may be discharged from a gas introduction port (not shown) without passing through the upper electrode 102.

In step S21, specifically, for example, first, in the processing module 60 which is the installation target of the edge ring E, an inert gas such as a nitrogen gas is supplied from the gas supply 140 into the processing space 100*s* through the upper electrode 102, and air in the chamber 100 is exhausted by the exhaust system 160. Accordingly, the pressure in the chamber 100 is adjusted to a quasi-high vacuum having a higher vacuum level than the inner space of the transfer module 50. Then, the corresponding gate valve 62 is open, and the fork 72 holding the edge ring E is inserted into the chamber 100 through the loading and unloading port (not shown). The edge ring E is transferred above the upper surface 104*b* of the peripheral portion of the electrostatic chuck 104 and the upper surface 105*a* of the support 105 by the fork 72. Subsequent processing in step S21 is similar to step S2.

After step S21, steps S2 and S3 are performed in a state where the pressure in the chamber 100 is adjusted to a quasi-high vacuum having a higher vacuum level than the inner space of the transfer module 50.

Further, after steps S2 and S3, the discharge of the gas into the processing space 100*s* through the upper electrode 102 is stopped, and as in step S4, the pressure in the supply path including the gas discharge hole 104*c* is increased in a state where the pressure in the chamber 100 is set to a high vacuum (step S22). The pressure in the supply path including the gas discharge hole 104*c* may be increased in a state where the pressure in the chamber 100 is set to a quasi-high vacuum, without stopping the discharge of the gas into the processing space 100*s*.

After step S22, steps from step S5 of Example 1 of the installation sequence are performed.

Example 4 of Installation Sequence

In Example 3 of the installation sequence, step S2 is performed after step S21 in a state where the pressure in the chamber 100 is adjusted to a quasi-high vacuum having a higher vacuum level than the inner space of the transfer module 50. However, step S2 may be performed in parallel with step S21, as in Example 2 of the installation sequence.

Example 5 of Installation Sequence

Figure 16:
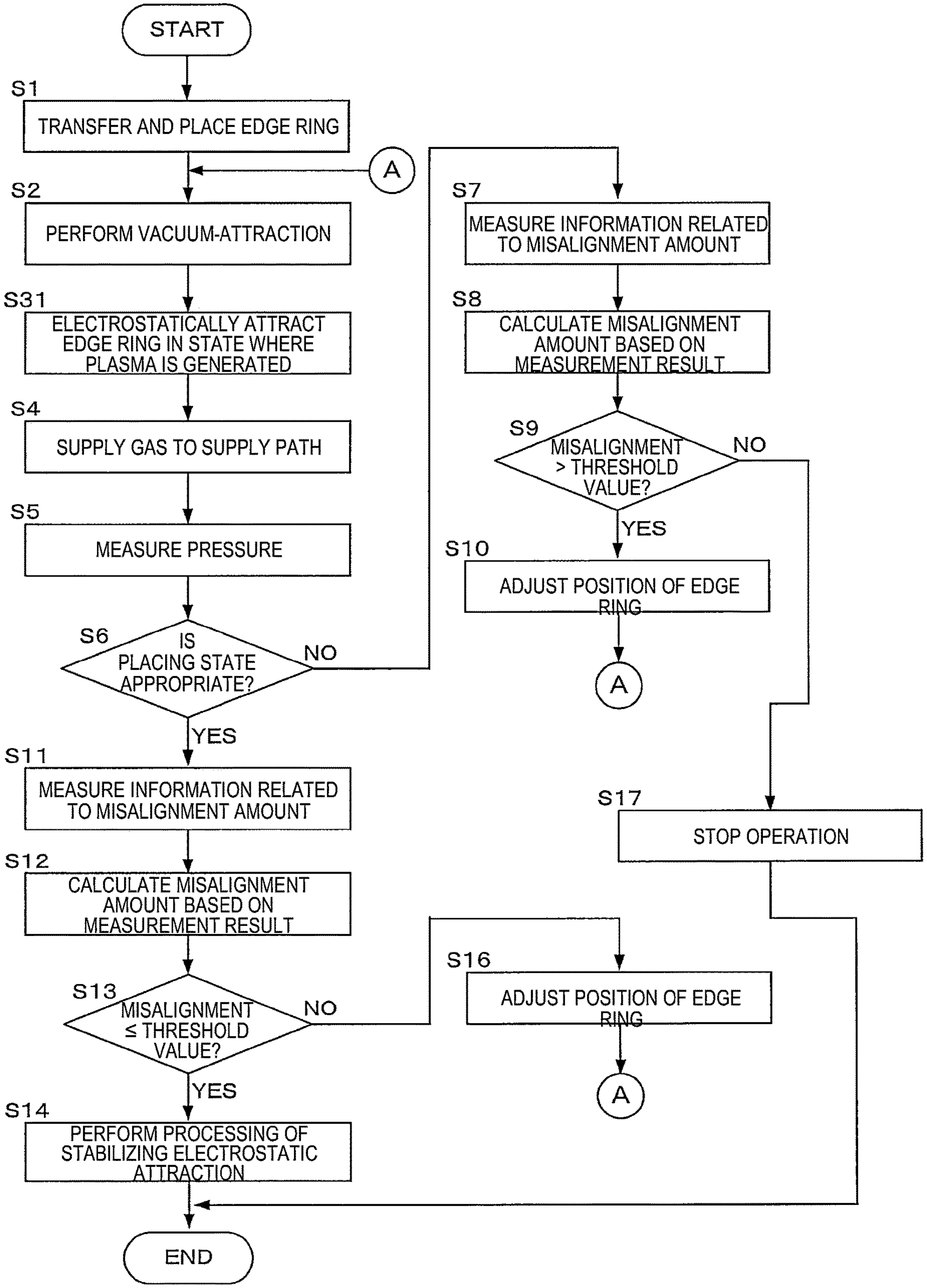
FIG. 16 is a flowchart showing Example 5 of the installation sequence of the edge ring.

FIG. 16 is a flowchart showing Example 5 of the installation sequence of the edge ring E.

In Example 1 of the installation sequence, in step S3, the edge ring E is electrostatically attracted in a state where the plasma is not generated in the chamber 100.

Meanwhile, in the present example, as shown in FIG. 16, step S31 described below is performed instead of step S3 after steps S1 and S2 of Example 1 of the installation sequence are performed in order. In step S31, the gas for plasma generation is discharged into the processing space 100*s* through the upper electrode 102, and air in the chamber 100 is exhausted by the exhaust system 160. Further, the RF power HF for plasma generation is supplied from the RF power supply 150 to, for example, the lower electrode 103. Accordingly, the gas in the processing space 100*s* is excited to generate the plasma. Although an example in which the RF power HF for plasma generation is supplied to the lower electrode 103 has been described, the present disclosure is not limited to this, and the RF power HF may be supplied to the upper electrode 102. Then, as in step S3, a voltage is applied to the electrode 111 of the electrostatic chuck 104 without the wafer W in the chamber 100, the edge ring E is placed on the ring placing surface, and gas is being exhausted through the gas discharge hole 104*c*. The edge ring E is electrostatically attracted to the ring placing surface.

After step S31, steps from step S4 of Example 1 of the installation sequence are performed.

Example 6 of Installation Sequence

In Example 5 of the installation sequence, step S2 is performed after step S1. However, step S2 may be performed in parallel with step S1 as in Example 2 of the installation sequence.

Modification Examples of Examples 5 and 6 of Installation Sequence

Step S21 of Example 3 of the installation sequence may be performed instead of step S1 of Examples 5 and 6 of the installation sequence, and after step S21, step S2 may be performed in a state where the pressure in the chamber 100 is adjusted to a quasi-high vacuum having a higher vacuum level than the inner space of the transfer module 50.

Example 7 of Installation Sequence

Figure 17:
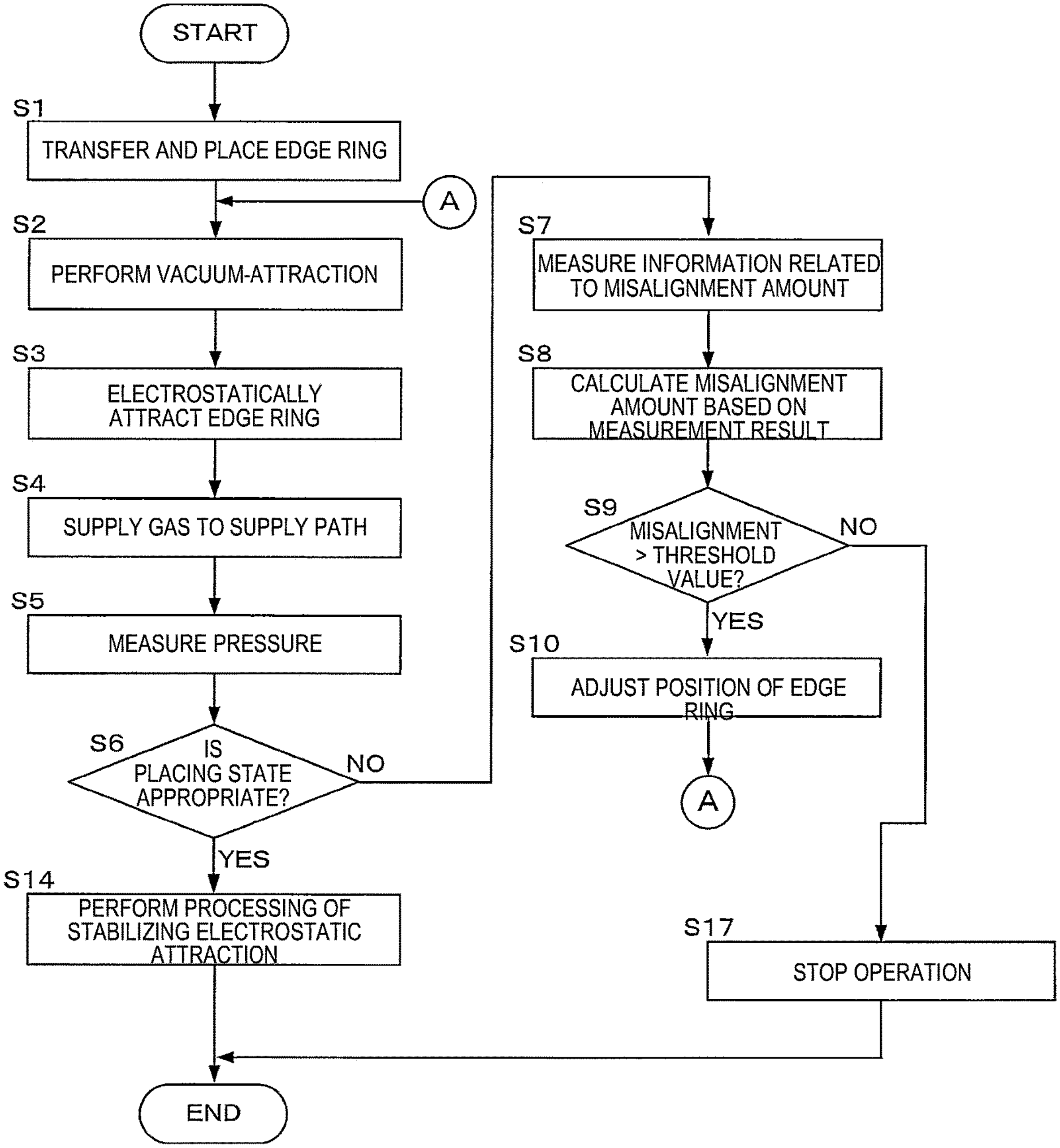
FIG. 17 is a flowchart showing Example 7 of the installation sequence of the edge ring.

FIG. 17 is a flowchart showing Example 7 of the installation sequence of the edge ring E.

In Example 1 of the installation sequence and the like, when a determination that the placing state of the edge ring E is appropriate is made in step S6 (YES), step S11 similar to step S7 is performed, and the measurement unit 73 measures the information related to the misalignment amount of the edge ring E with respect to the electrostatic chuck 104.

Meanwhile, in the present example, as shown in FIG. 17, when a determination that the placing state of the edge ring E is appropriate is made in step S6 (YES), step S11 is not performed, and processing of stabilizing the electrostatic attraction of the edge ring E in step S14 is performed.

Main Effects of Examples 1 to 7 of Installation Sequence

In Examples 1 to 7 of the installation sequence, a step of lowering the edge ring E that is transferred into the chamber 100 by the transfer robot 70 and that is transferred to the elevation mechanism including the lifter 108, via the elevation mechanism and placing the edge ring E on the ring placing surface, and a step of electrostatically attracting the placed edge ring E to the ring placing surface are performed. Further, in Examples 1 to 7 of the installation sequence, after the step of the electrostatic attraction, a step of supplying the gas to the supply path to maintain the pressure in the supply path including the gas discharge hole 104*c* to be higher than the pressure in the chamber 100, a step of measuring the pressure in the supply path, and a step of determining the placing state of the edge ring E based on the measured pressure are performed. In one or more embodiments of the present application, the placing state of the edge ring E is determined in such a manner. Thus, when the placing state of the edge ring Eis not appropriate, the edge ring E can be accurately placed on the electrostatic chuck 104 by, for example, adjusting the position of the edge ring E on the ring placing surface by the transfer robot.

Further, in Examples 1 to 7 of the installation sequence, a step of vacuum-attracting the edge ring E to the ring placing surface is performed before the electrostatic attraction of the edge ring E placed on the ring placing surface. Thus, the gas present in the gap between the ring placing surface and the edge ring E can be reduced when the edge ring E is electrostatically attracted to the ring placing surface. Accordingly, when the edge ring E is electrostatically attracted to the ring placing surface, misaligning of the edge ring E with respect to the electrostatic chuck 104 because of the gas present in the gap acting as an obstacle can be suppressed.

Further, in Examples 1 to 7 of the installation sequence, in determining deviation of the edge ring E, whether leaking of the heat transfer gas occurs when the heat transfer gas is supplied to the gap during the plasma processing can be checked before the plasma processing. When the heat transfer gas leaks during the plasma processing, it is difficult to, for example, appropriately adjust the temperature of the edge ring E through the electrostatic chuck 104 and through the heat transfer gas. Meanwhile, in Examples 1 to 7 of the installation sequence, as described above, since whether the heat transfer gas leaks during the plasma processing can be checked in advance, the difficulty of appropriately adjusting the temperature of the edge ring E and the like can be suppressed.

Example 8 of Installation Sequence

Figure 18:
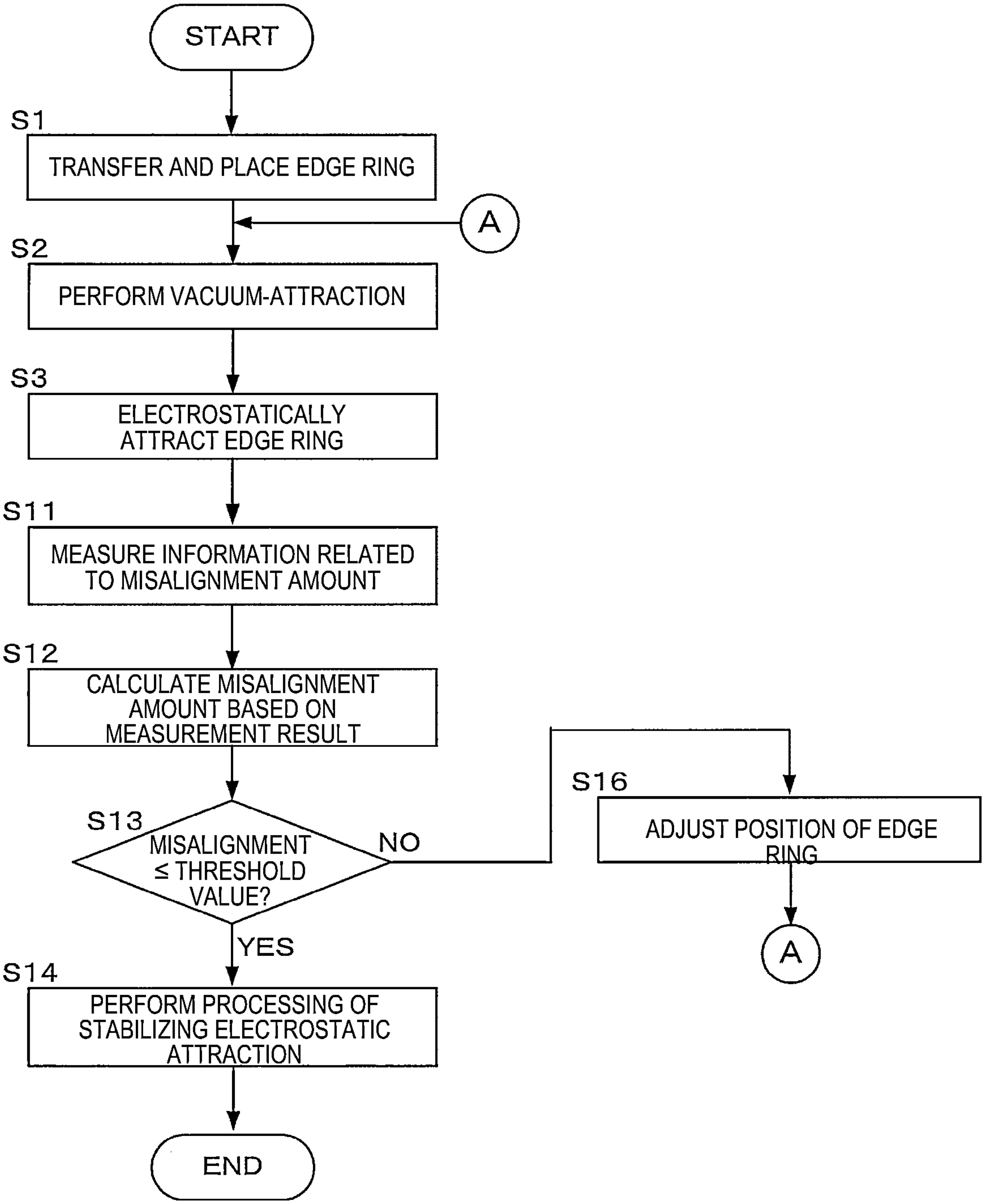
FIG. 18 is a flowchart showing Example 8 of the installation sequence of the edge ring.

FIG. 18 is a flowchart showing Example 8 of the installation sequence of the edge ring E.

In Example 1 of the installation sequence, after the edge ring E is electrostatically attracted to the ring placing surface in step S3, the heat transfer gas is supplied to the supply path including the gas discharge hole 104*c*, that is, the space between the ring placing surface and the rear surface of the edge ring E, in step S4. Next, steps S5 and S6 are performed, and the placing state of the edge ring E is determined. Then, in step S7 or step S11, the measurement unit 73 of the transfer robot 70 measures the information related to the misalignment amount of the edge ring E with respect to the electrostatic chuck 104.

Meanwhile, in the present example, as shown in FIG. 18, after the edge ring E is electrostatically attracted to the ring placing surface in step S3, step S11 is performed, and the measurement unit 73 measures the information related to the misalignment amount of the edge ring E with respect to the electrostatic chuck 104.

After step S11, steps from step S12 of Example 1 of the installation sequence are performed.

Specifically, in step S12, the controller 80 calculates the misalignment amount of the edge ring E with respect to the electrostatic chuck 104 based on the measurement result of the measurement unit 73.

Next, the controller 80 determines whether the misalignment amount calculated in step S12 is less than or equal to the threshold value (step S13). When a determination that the misalignment amount is less than or equal to the threshold value is made in step S13 (YES), processing of stabilizing the electrostatic attraction of the edge ring E is performed (step S14).

Example 9 of Installation Sequence

In Example 8 of the installation sequence, step S2 is performed after step S1 as in Example 1 of the installation sequence. However, step S2 may be performed in parallel with step S1.

Example 10 of Installation Sequence

Step S21 of Example 3 of the installation sequence may be performed instead of step S1 of Examples 8 and 9 of the installation sequence, and after step S21, steps S2 and S3 may be performed in a state where the pressure in the chamber 100 is adjusted to a quasi-high vacuum having a higher vacuum level than the inner space of the transfer module 50.

Example 11 of Installation Sequence

After steps S1 and S2 of Examples 8 and 9 of the installation sequence, step S31 of Example 5 of the installation sequence may be performed instead of step S3, and the edge ring E may be electrostatically attracted in a state where the plasma is generated in the chamber 100.

Example 12 of Installation Sequence

Before the electrostatic attraction of the edge ring E in step S3 and step S31 in Examples 8 to 11 of the installation sequence, the measurement unit 73 may measure the information related to the misalignment amount of the edge ring E with respect to the electrostatic chuck 104, as in step S11. Then, before the electrostatic attraction of the edge ring E in step S31, the controller 80 may calculate the misalignment amount of the edge ring E with respect to the electrostatic chuck 104 based on the measurement result of the measurement unit 73, as in step S12.

That is, steps S11 and S12 may be performed before the electrostatic attraction of the edge ring E in steps S3 and S31 in Examples 8 to 11 of the installation sequence.

Main Effects of Examples 8 to 12 of Installation Sequence

In Examples 8 to 12 of the installation sequence, after the step of electrostatically attracting the edge ring E to the ring placing surface, the measurement unit 73 provided in the fork 72 of the transfer robot 70 measures the information related to the misalignment amount of the edge ring E with respect to the electrostatic chuck 104. Thus, the actual misalignment amount of the edge ring E installed in Examples 8 to 12 of the installation sequence with respect to the electrostatic chuck 104 can be calculated, that is, acquired. In one or more embodiments of the present application, the misalignment amount of the edge ring E is acquired in such a manner. Thus, when the misalignment amount of the edge ring E with respect to the electrostatic chuck 104 is large, the edge ring E can be accurately placed by, for example, adjusting the position of the edge ring E on the ring placing surface. Further, performing the plasma processing with a large misalignment amount can be suppressed.

Further, in Examples 8 to 12 of the installation sequence, as in Examples 1 to 7 of the installation sequence, the gas present in the gap between the ring placing surface and the edge ring E can be reduced when the edge ring E is electrostatically attracted to the ring placing surface. Accordingly, when the edge ring E is electrostatically attracted to the ring placing surface, misaligning of the edge ring E with respect to the electrostatic chuck 104 because of the gas present in the gap acting as an obstacle can be suppressed.

Main Effects of Examples 5, 6, 11, and 12 of Installation Sequence

In Examples 5, 6, 11, and 12 of the installation sequence, in step S31, the edge ring E is electrostatically attracted in a state where the plasma is generated in the chamber 100. Accordingly, since charges are supplied from the plasma in the chamber 100 to the edge ring E on the ring placing surface, the edge ring E can be electrostatically attracted more strongly.

Modification Examples of Examples 1 to 7 of Installation Sequence

In step S4 or step S22, the predetermined gas supplied to the gap between the ring placing surface and the edge ring E is the heat transfer gas. However, for example, a nitrogen gas other than the heat transfer gas may be used.

When a determination that the placing state of the edge ring E is not appropriate is made in step S6 (NO), step S17 may be performed without performing steps S7 to S10, and the operation of the entirety or a part of the plasma processing system 1 may be stopped.

Modification Examples of Examples 8 to 12 of Installation Sequence

When a determination that the misalignment amount is less than or equal to the threshold value is made in step S13 (YES), steps S4 to S6 of Example 1 of the installation sequence may be performed before step S14 is performed. At this time, when a determination that the placing state of the edge ring E is not appropriate is made in step S6 (NO), the edge ring E may be temporarily removed from the wafer support 101 and then placed on the wafer support 101 again. Then, the steps from step S2 may be repeated. When a determination that the placing state of the edge ring E is not appropriate is made in step S6 (NO), step S17 may be performed instead of this, and the operation of the entirety or a part of the plasma processing system 1 may be stopped.

Modification Example of Example 12 of Installation Sequence

Step S13, that is, determining whether the misalignment amount calculated in step S12 is less than or equal to the threshold value, may be performed before the electrostatic attraction of the edge ring E in step S3 or the like and after step S11 and step S12. Here, when a determination that the misalignment amount is less than or equal to the threshold value is made, the steps from the step of electrostatically attracting the edge ring E, such as step S3, are performed. Meanwhile, when a determination that the misalignment amount exceeds the threshold value is made, for example, the sequence may return to step S2 after the position of the edge ring E is adjusted in step S16.

Modification Examples of Examples 3, 4, and 10 of Installation Sequence

In Examples 3, 4, and 10 of the installation sequence, an inert gas such as a nitrogen gas is supplied into the processing space 100*s*, and air in the chamber 100 is exhausted by the exhaust system 160. Accordingly, the pressure in the chamber 100 is adjusted to a quasi-high vacuum. After the adjustment, the gate valve 62 is open, and the edge ring E is loaded into the chamber 100. Instead, the pressure in the chamber 100 may be adjusted to a quasi-high vacuum after loading the edge ring E into the chamber 100 and closing the gate valve 62.

Modification Examples of Examples 1 to 12 of Installation Sequence

In the above examples, when leaking from the gap between the ring placing surface and the edge ring E occurs in step S6, or when the misalignment amount calculated in step S12 exceeds the threshold value in step S13 of Example 8 of the installation sequence, the operation of the entirety or a part (for example, only the corresponding processing module 60) of the plasma processing system 1 may be stopped.

Further, the step of vacuum-attracting the edge ring E in step S2 may be omitted.

Modification Example of Plasma Processing Apparatus

Unlike Examples 1 to 7 of the installation sequence, the pressure sensor 134 is not used in Examples 8 to 12 of the installation sequence. Accordingly, when Examples 8 to 12 of the installation sequence are adopted, the pressure sensor 134 may be omitted.

Although the measurement unit 73 includes the distance sensor, the measurement unit 73 may include a camera instead of the distance sensor as long as the information related to the misalignment amount of the edge ring E with respect to the electrostatic chuck 104 can be measured.

Further, although the gas exhaustion through the gas discharge hole 104*c* also serving as the exhaust hole and the air exhaustion in the chamber 100, that is, the processing space 100*s*, are performed by the common exhaust system 160, the air exhaustion may be performed by exhaust systems different from each other.

Further, the exhaust hole and the gas discharge hole 104*c* may be individually provided. That is, the exhaust path including the exhaust hole for exhausting air between the rear surface of the edge ring E and the ring placing surface and the supply path including the gas discharge hole 104*c* may be individually provided.

In addition to the edge ring E, a cover ring may be placed on the wafer support used in the plasma processing apparatus to cover an outer surface of the edge ring. The technique of the present disclosure can also be applied to this case.

Figure 19:
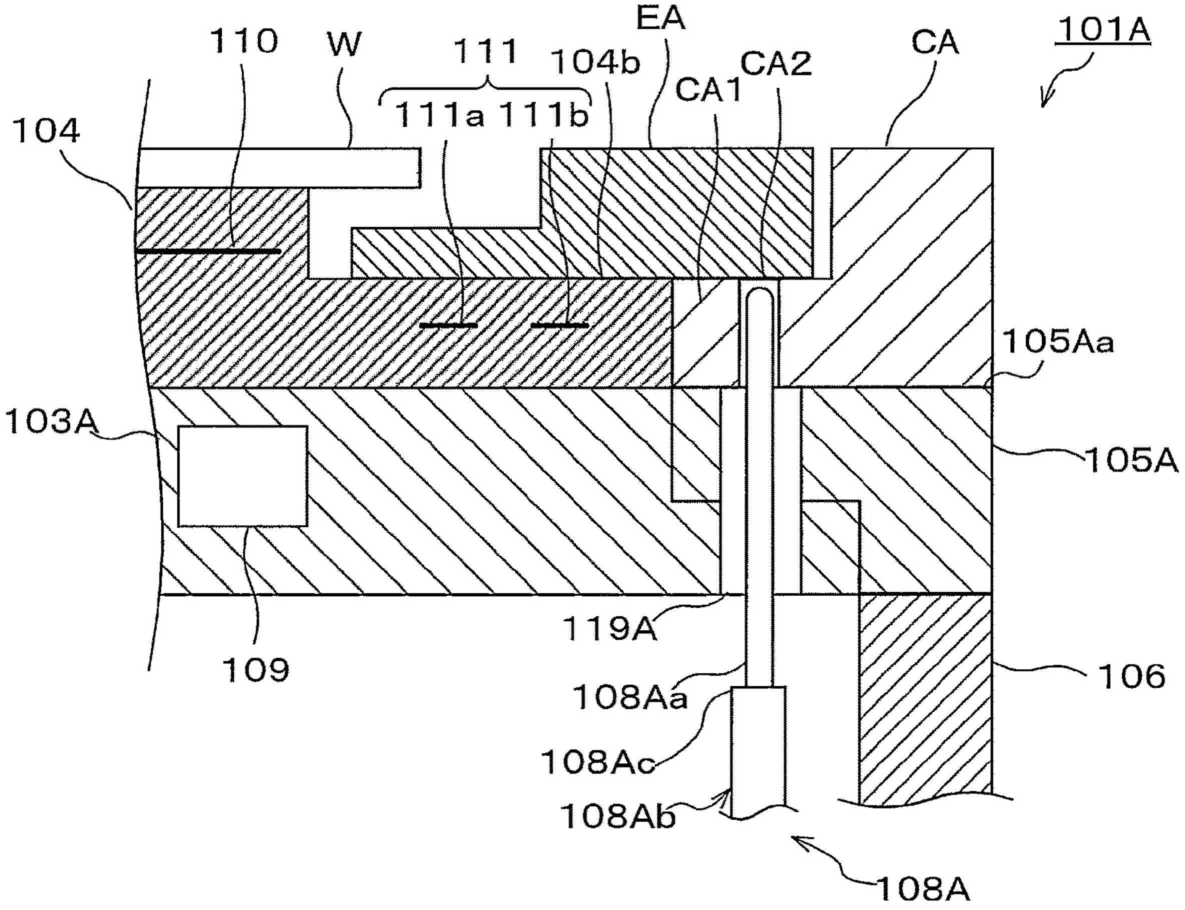
FIG. 19 is a partially enlarged view for describing an example of the wafer support on which a cover ring is configured to be placed in addition to the edge ring.

FIG. 19 is a partially enlarged view for describing an example of a wafer support on which a cover ring CA is configured to be placed in addition to an edge ring EA.

Hereinafter, a wafer support 101A in FIG. 19 will be mainly described based on its differences from the wafer support 101 shown in FIG. 3 or the like.

Similar to the wafer support 101 shown in FIG. 3 or the like, the wafer support 101A in FIG. 19 not only includes the electrostatic chuck 104, the insulator 106, and the lifter 107 but also a lower electrode 103A, a support 105A, and a lifter 108A. Both of the edge ring EA and the cover ring CA are configured to be placed on the wafer support 101A.

A lower outer peripheral portion of the lower electrode 103A and an upper inner peripheral portion of the support 105A are formed to overlap with each other in plan view. Further, the lower electrode 103A and the support 105A are provided with an insertion hole 119A into which the lifter 108A is inserted. The insertion hole 119A is formed to extend downward from an upper surface 105Aa of an inner peripheral portion of the support 105A to a bottom surface of the lower outer peripheral portion of the lower electrode 103A.

The electrostatic chuck 104 is provided to be placed on the lower electrode 103A. The edge ring EA is placed on the upper surface 104*b* of the peripheral portion of the electrostatic chuck 104, and the cover ring CA is placed on the upper surface 105Aa of the support 105A. A height of the upper surface 105Aa of the support 105A and a height of an upper surface of the lower electrode 103A substantially coincide with each other.

The edge ring EA is formed to have a larger outer diameter than the electrostatic chuck 104. Accordingly, when the edge ring EA is placed on the upper surface 104*b* of the peripheral portion of the electrostatic chuck 104, a peripheral portion of the edge ring EA horizontally protrudes outward from the peripheral portion of the electrostatic chuck 104.

The cover ring CA is a member disposed to cover an outer surface of the edge ring EA. Similar to the edge ring EA, the cover ring CA is also formed to have an annular shape in plan view. In one or more embodiments of the present application, the cover ring CA has a projection CA1 that protrudes inward in a diameter direction at a bottom thereof.

Further, the cover ring CA has a through hole CA2 into which the lifter 108A is inserted, at a position corresponding to each lifter 108A. The through hole CA2 passes through the cover ring CA from a bottom surface of the cover ring CA to the edge ring EA. The through hole CA2 is provided in a part (specifically, for example, the projection CA1) that overlaps with the peripheral portion of the edge ring EA and that overlaps with an inner peripheral portion of the cover ring CA in plan view.

The lifter 108A is configured to protrude from the upper surface 105Aa of the inner peripheral portion of the support 105A and is elevated such that an amount of protrusion from the upper surface 105Aa is adjustable. Specifically, the lifter 108A is configured to protrude from a position overlapping with the edge ring EA and the cover ring CA in plan view on the upper surface 105Aa of the inner peripheral portion of the support 105A. The insertion hole 119A into which the lifter 108A is inserted is formed at a position overlapping with the edge ring EA and the cover ring CA in plan view.

Similar to the lifter 108 in FIG. 3 or the like, three or more lifters 108A are provided at intervals from each other along the circumferential direction of the electrostatic chuck 104.

Further, the lifter 108A has a first engaging portion 108Aa and a second engaging portion 108Ab.

The first engaging portion 108Aa is configured with an upper portion of the lifter 108A. For example, the first engaging portion 108Aa is formed to have a columnar shape except for its upper end portion (that is, a tip), and the upper end portion is formed to have a hemispherical shape. The first engaging portion 108Aa protrudes upward from the through hole CA2 of the cover ring CA and engages with the edge ring EA. When the lifter 108A is raised, the first engaging portion 108Aa passes through the through hole CA2 of the cover ring CA and comes into contact with a bottom surface of the edge ring EA. Accordingly, the edge ring EA is configured to be supported from its bottom surface.

The second engaging portion 108Ab is positioned below the first engaging portion 108Aa and engages with the cover ring CA. The second engaging portion 108Ab comes in contact with the bottom surface of the cover ring CA without passing through the through hole CA2 of the cover ring CA. Accordingly, the cover ring CA is configured to be supported from its bottom surface.

Further, the second engaging portion 108Ab is connected to a base end side of the first engaging portion 108Aa along an axial direction of the lifter 108A. Further, the second engaging portion 108Ab has a protruding portion 108Ac that protrudes outward from a periphery of the first engaging portion 108Aa, at a position connected to the first engaging portion 108Aa.

Specific shapes of the first engaging portion 108Aa, the second engaging portion 108Ab, and the protruding portion 108Ac are not particularly limited. For example, the first engaging portion 108Aa, the second engaging portion 108Ab, and the protruding portion 108Ac may be cylindrical members and coaxial with each other.

The actuator 116 elevates the cover ring CA by elevating the lifter 108A of which the second engaging portion 108Ab is engaged with the cover ring CA.

The actuator 116 also elevates the edge ring EA by elevating the lifter 108A of which the first engaging portion 108Aa is engaged with the edge ring EA.

In the shown example, in a state where the lifter 108A is most lowered, the second engaging portion 108Ab is not positioned in the insertion hole 119A. However, the second engaging portion 108Ab may be positioned in the insertion hole 119A. In this case, a sleeve (not shown) may be provided in a hole of the lower electrode 103A constituting the insertion hole 119A. The lifter 108A is inserted into the sleeve, and the lifter 108A is fitted to be positioned with respect to the lower electrode 103A. Accordingly, the lifter 108A is positioned with respect to the electrostatic chuck 104. By this positioning, the edge ring EA and the cover ring CA supported by the lifter 108A are also positioned.

When the wafer support 101A is used, installation of the edge ring EA may be performed with the edge ring EA alone or at the same time as installation of the cover ring CA.

When the edge ring EA is installed alone, for example, a step of placing the edge ring EA on the wafer support 101A is performed as follows.

That is, for example, the transfer robot 70 loads the edge ring EA in the accommodation module 61 into the chamber 100 of the processing module 60 that is an installation target of the edge ring EA.

Specifically, the edge ring EA in the accommodation module 61 is held by the fork 72 of the transfer robot 70. Next, the fork 72 holding the edge ring EA is inserted into the chamber 100 of the processing module 60, which is the installation target, through the loading and unloading port (not shown). The edge ring EA is transferred above the upper surface 104*b* of the peripheral portion of the electrostatic chuck 104 by the fork 72. At this time, the cover ring CA is in a state of being placed on the upper surface 105Aa of the support 105A.

Next, the edge ring EA is placed on the electrostatic chuck 104 from the transfer robot 70.

Specifically, all lifters 108A are raised, and the edge ring EA is transferred from the fork 72 to the first engaging portion 108Aa of the lifter 108A that has passed through the through hole CA2 of the cover ring CA. At this time, the lifter 108A is raised until the top of the first engaging portion 108Aa reaches a predetermined height. Here, the predetermined height is a height at which the fork 72 does not interfere with the edge ring EA, the cover ring CA, and the like when the fork 72 is inserted and retracted between the cover ring CA placed on the support 105A and the edge ring EA supported by the first engaging portion 108Aa.

Next, the fork 72 is retracted from the chamber 100. Further, the lifter 108A is lowered. Accordingly, the edge ring EA is placed on the upper surface 104*b* of the peripheral portion of the electrostatic chuck 104.

Meanwhile, when the edge ring EA is installed at the same time as the cover ring CA, for example, a step of placing the edge ring EA on the wafer support 101A is performed as follows.

That is, for example, the transfer robot 70 loads the cover ring CA supporting the edge ring EA in the accommodation module 61 into the chamber 100 of the processing module 60 that is an installation target of the edge ring EA and the cover ring CA.

Specifically, the cover ring CA supporting the edge ring EA in the accommodation module 61 is held by the fork 72 of the transfer robot 70. Next, the fork 72 holding the cover ring CA is inserted into the chamber 100 of the processing module 60, which is the installation target, through the loading and unloading port (not shown). The cover ring CA supporting the edge ring EA is transferred above the upper surface 104*b* of the peripheral portion of the electrostatic chuck 104 and the upper surface 105Aa of the support 105A by the transfer arm 71.

Next, the edge ring EA and the cover ring are placed on the electrostatic chuck 104 and the support 105A from the transfer robot 70.

Specifically, all lifters 108A are raised, and the edge ring EA is transferred from the cover ring CA held by the fork 72 to the first engaging portion 108Aa of the lifter 108A that has passed through the through hole CA2 of the cover ring CA. Then, all lifters 108A continue to be raised, and the cover ring CA is transferred from the fork 72 to the second engaging portion 108Ab of the lifter 108A. At this time, the lifter 108A is raised until the top of the second engaging portion 108Ab reaches a predetermined height. Here, the predetermined height is a height at which the fork 72 does not interfere with the cover ring CA and the like when the fork 72 is inserted and retracted between the upper surface 104*a* of the central portion of the electrostatic chuck 104 and the cover ring CA supported by the second engaging portion 108Ab.

Next, the fork 72 is retracted from the chamber 100. Further, the lifter 108A is lowered. Accordingly, the edge ring EA and the cover ring CA are placed on the upper surface 104*b* of the peripheral portion of the electrostatic chuck 104 and the upper surface 105Aa of the support 105A. Specifically, first, the cover ring CA is placed on the upper surface 105Aa of the support 105A, and then the edge ring EA is placed on the upper surface 104*b* of the peripheral portion of the electrostatic chuck 104.

The edge ring may be configured as follows. That is, the edge ring may be configured such that the edge ring moves (specifically, slides on the lifter) via its own weight or the like to be positioned with respect to the lifter even when the edge ring is misaligned with respect to the lifter immediately after being transferred to the lifter.

Figure 20:
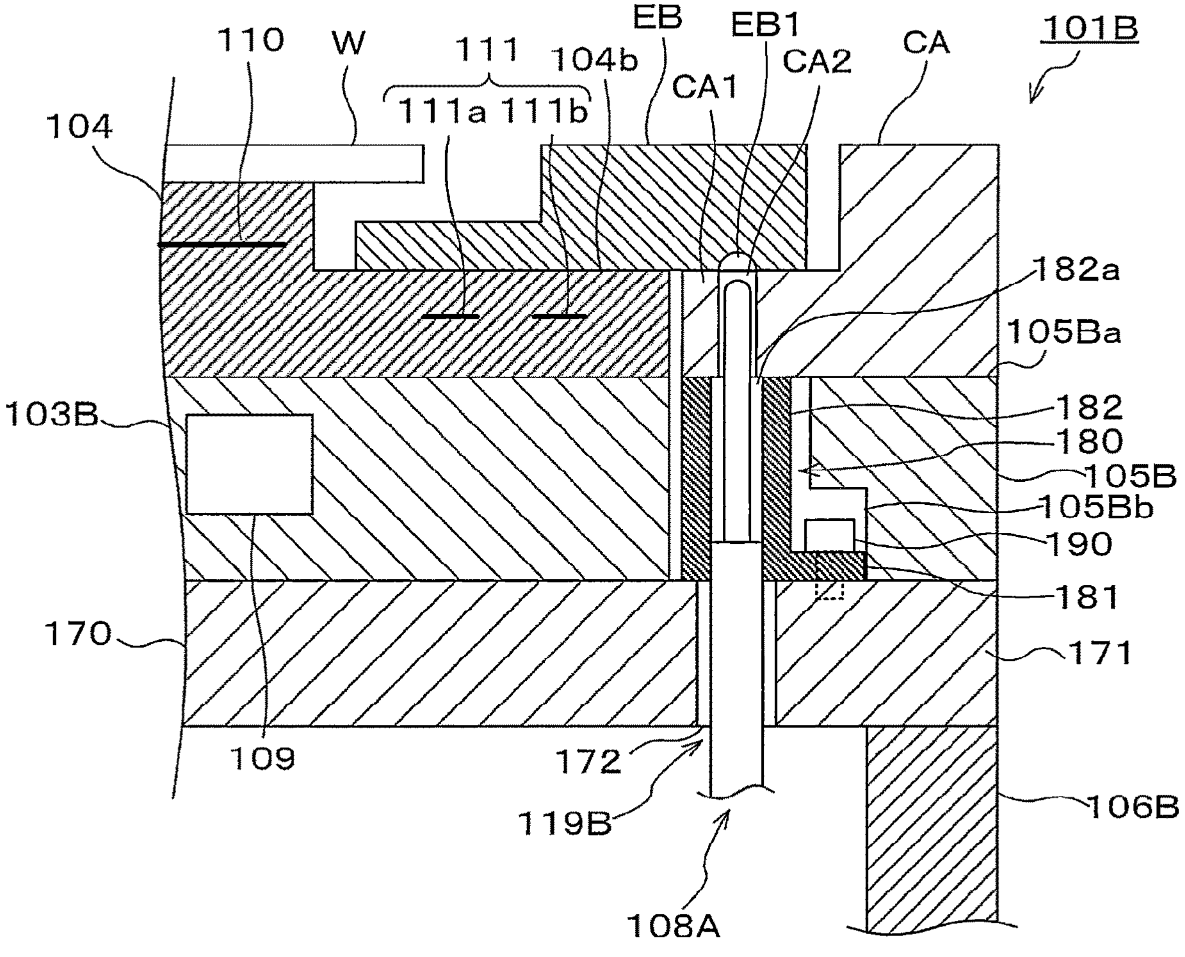
FIG. 20 is a partially enlarged view for describing another example of the wafer support on which the cover ring is configured to be placed in addition to the edge ring.

A recess EB1 for positioning with respect to the lifter 108A as described above is provided at a position corresponding to each lifter 108A on a lower surface of an edge ring EB in FIG. 20. The recess EB1 has a flare shape that widens downward. When the edge ring EB is misaligned with respect to a plurality of lifters 108A immediately after being transferred to the plurality of lifters 108A, the edge ring EB moves with respect to the plurality of lifters 108A such that an upper end portion of each lifter 108A relatively slides along a recessed surface forming the recess EB1. Thus, the edge ring EB can be positioned with respect to the plurality of lifters 108A.

When the edge ring EB is used, for example, a wafer support 101B in FIG. 20 is used. The technique of the present disclosure can also be applied to a case where the wafer support 101B in FIG. 20 is used.

Hereinafter, the wafer support 101B will be mainly described based on its differences from the wafer support 101A shown in FIG. 19.

Similar to the wafer support 101A, the wafer support 101B not only includes the electrostatic chuck 104, the lifter 107, and the lifter 108A but also a lower electrode 103B, a support 105B, an insulator 106B, and a low thermal expansion member 170.

The low thermal expansion member 170 is a member that is formed to have a plate shape and that has a lower coefficient of thermal expansion than the lower electrode 103B, and is made of, for example, a ceramic material. The lower electrode 103B is provided to be placed on the low thermal expansion member 170.

In the wafer support 101A, the lower electrode 103A has a larger diameter than the electrostatic chuck 104 in plan view.

Meanwhile, in the wafer support 101B, the lower electrode 103B has substantially the same diameter as the electrostatic chuck 104 in plan view. Further, the low thermal expansion member 170 is formed to have a larger diameter than the electrostatic chuck 104 in plan view. That is, the low thermal expansion member 170 has an outer peripheral portion 171 that does not overlap with the lower electrode 103B in plan view.

The support 105B formed to have an annular shape in plan view is provided to be placed on the outer peripheral portion 171 of the low thermal expansion member 170.

Further, a through hole 172 into which the lifter 108A is inserted is provided in the outer peripheral portion 171 of the low thermal expansion member 170.

Further, a sleeve member 180 is provided to be placed on the outer peripheral portion 171 of the low thermal expansion member 170 in accordance with the through hole 172. Similar to the low thermal expansion member 170, the sleeve member 180 also has a lower coefficient of thermal expansion than the lower electrode 103B. The sleeve member 180 has a fixed portion 181 and a sleeve main body 182.

The fixed portion 181 is fixed with respect to the low thermal expansion member 170. For example, the fixed portion 181 is formed to extend outward from the sleeve main body 182 and is fixed to the low thermal expansion member 170 by a screw 190. By fixing the fixed portion 181 with respect to the low thermal expansion member 170, the sleeve member 180 is fixed with respect to the low thermal expansion member 170. The sleeve member 180 is fixed at a gap with respect to the lower electrode 103B to avoid contact with the thermally expanded lower electrode 103B.

The sleeve main body 182 has a through hole 182*a* into which the lifter 108A is inserted. The through hole 182*a* communicates with the through hole 172 of the low thermal expansion member 170. By fitting between the sleeve main body 182 and the inserted lifter 108A, the lifter 108A is positioned with respect to the low thermal expansion member 170 to which the sleeve member 180 is fixed.

A recess 105Bb is provided at a position corresponding to the through hole 172 in the support 105B. The sleeve member 180 and the screw 190 are accommodated in the recess 105Bb. The recess 105Bb is provided such that the lifter 108A inserted into the sleeve member 180 in the recess 105Bb can protrude above the support 105B. For example, the recess 105Bb has an opening with respect to a space above the support 105B, and an upper end portion of the sleeve member 180 is inserted into the opening.

In the wafer support 101B, an insertion hole 119B into which the lifter 108A is inserted is configured with the through hole 172 of the low thermal expansion member 170, the through hole 182*a* of the sleeve member 180, and the recess 105Bb of the support 105B.

Even in the wafer support 101B, the cover ring CA is placed on an upper surface 105Ba of the support 105B. Further, a height of the upper surface 105Ba of the support 105B and a height of an upper surface of the lower electrode 103B substantially coincide with each other.

The insulator 106B is a member of a cylindrical shape formed of a ceramic material or the like and supports the support 105B or the like by supporting the low thermal expansion member 170. For example, the insulator 106B is formed to have an outer diameter equal to an outer diameter of the low thermal expansion member 170 and supports a peripheral portion of the low thermal expansion member 170.

When the wafer support 101B is used, the sleeve member 180 is positioned with respect to the electrostatic chuck 104 and fixed to the low thermal expansion member 170. Further, as described above, the low thermal expansion member 170 and the sleeve member 180 have a lower coefficient of thermal expansion than the lower electrode 103B, and the sleeve member 180 is fixed at a gap with respect to the lower electrode 103B as described above. Accordingly, even at a high temperature, a positional relationship between the lifter 108A positioned in the sleeve member 180 and the electrostatic chuck 104 is less susceptible to an effect of thermal expansion of the lower electrode 103B or the like. Thus, the edge ring EB positioned with respect to the lifter 108A can be accurately installed at an appropriate position with reference to the electrostatic chuck 104 through the lifter 108A even at a high temperature.

Further, in the wafer support 101B, a diameter of the lower electrode 103B in plan view can be reduced within a range greater than the diameter of the wafer W. Accordingly, a state of the plasma generated when a voltage is applied to the lower electrode 103B can be made more uniform in a plane of the wafer W. Accordingly, a uniform plasma processing result in the plane of the wafer W can be obtained.

Even when the wafer support 101 shown in FIG. 3 or the like is used, or the wafer support 101A in FIG. 19 is used, a recess similar to the recess EB1 of the edge ring EB may be provided on the lower surface of the edge ring.

Figure 21:
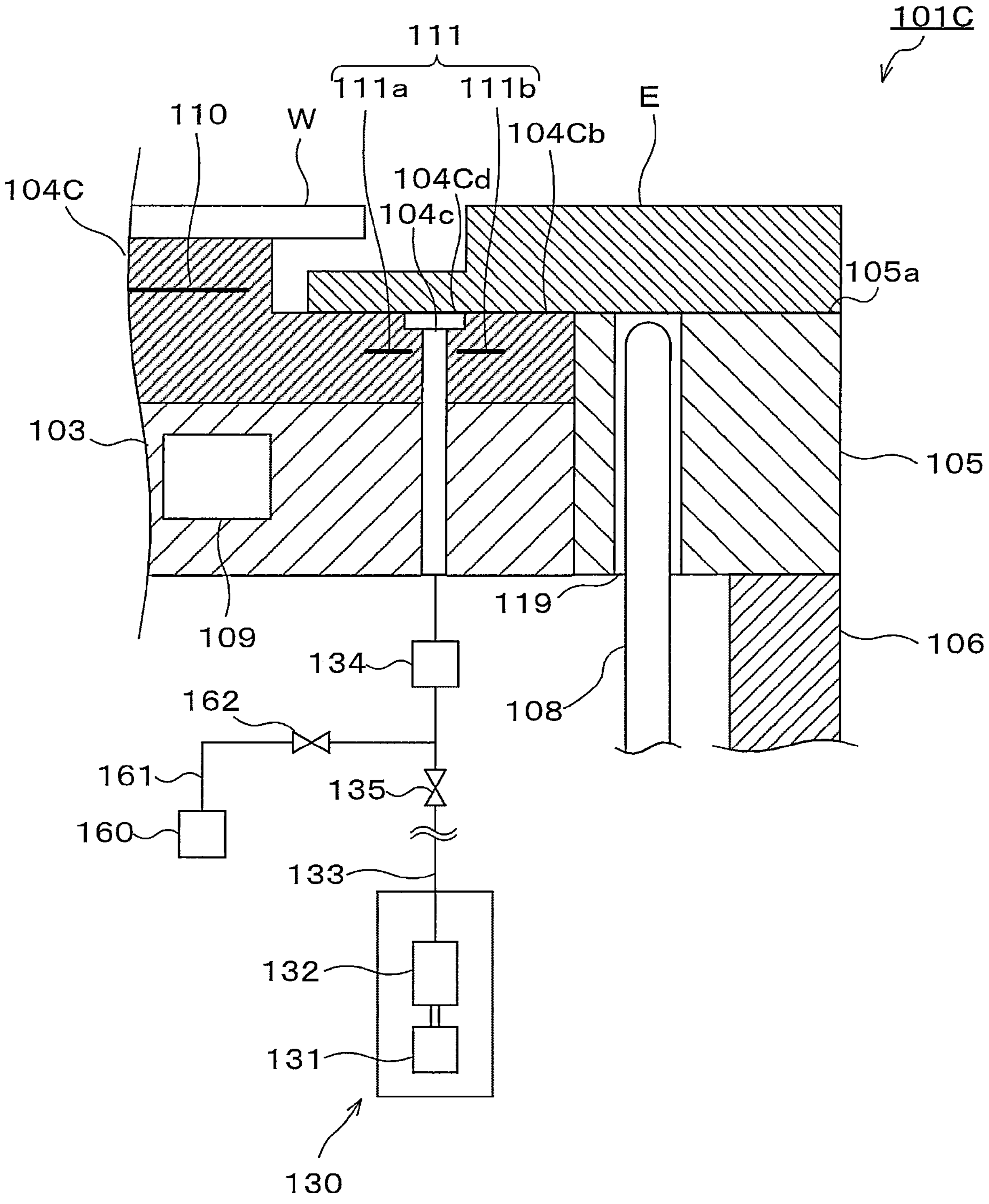
FIG. 21 is a partially enlarged view for describing another example of an electrostatic chuck.

Further, as in a wafer support 101C in FIG. 21, a groove 104Cd recessed downward may be formed to have an annular shape in plan view on an upper surface 104Cb of a peripheral portion of an electrostatic chuck 104C. The gas discharge hole 104*c* may be formed in the groove 104Cd. Specifically, one end of the gas discharge hole 104*c* may be open in the groove 104Cd.

Even when the wafer support 101A in FIG. 19 or the wafer support 101B in FIG. 20 is used, a groove similar to the groove 104Cd may be provided on the upper surface of the peripheral portion of the electrostatic chuck.

It shall be understood that the embodiments disclosed herein are illustrative and are not restrictive in all aspects. The embodiment described above may be omitted, replaced, or modified in various forms without departing from the scope and spirit of the appended claims. For example, the components of the embodiments described above may be combined as desired. From the desired combination, functions and effects of each component related to the combination can be obtained as a matter of course, and other functions and effects apparent to those skilled in the art can be obtained from the description herein.

The effects described herein are merely illustrative or exemplary, and are not limited. In other words, the technique according to the present disclosure may have other effects apparent to those skilled in the art from the description herein, in addition to or in place of the effects described above.

The following configuration examples also fall within the technical scope of the present disclosure.

(1) A substrate processing system including a plasma processing apparatus, a pressure-reduced transfer device connected to the plasma processing apparatus, and a controller, in which the plasma processing apparatus has a processing container configured to be pressure-reduced, a substrate support that is provided in the processing container and that includes a substrate placing surface, a ring placing surface on which an edge ring is placed to surround the substrate placing surface, and an electrostatic chuck that electrostatically attracts the edge ring to the ring placing surface, an elevation mechanism that elevates the edge ring with respect to the ring placing surface, a supply path for supplying a gas to a space between a rear surface of the edge ring and the ring placing surface, and a pressure sensor connected to the supply path, the pressure-reduced transfer device has a transfer robot that transfers the edge ring, and the controller controls lowering the edge ring that is transferred into the processing container by the transfer robot and that is transferred to the elevation mechanism, via the elevation mechanism and placing the edge ring on the ring placing surface, electrostatically attracting the placed edge ring to the ring placing surface, supplying the gas to the supply path to maintain a pressure in the supply path to be higher than a pressure in the processing container after the electrostatic attracting, measuring the pressure in the supply path, and determining a placing state of the edge ring on the ring placing surface based on the measured pressure.

(2) The substrate processing system according to (1), in which the electrostatic chuck includes a first electrode and a second electrode formed at positions different from each other, and any one of voltages having polarities different from each other or voltages having the same polarity are configured to be applied to the first electrode and the second electrode.

(3) The substrate processing system according to (1) or (2), in which the plasma processing apparatus further has a gas supply that discharges another gas into the processing container, and in the placing, the edge ring is placed on the ring placing surface while the other gas is discharged into the processing container.

(4) The substrate processing system according to any one of (1) to (3), in which the plasma processing apparatus further has a plasma generator that generates a plasma in the processing container, and in the electrostatic attracting, the edge ring is electrostatically attracted in a state where the plasma is generated in the processing container.

(5) The substrate processing system according to any one of (1) to (4), in which in the measuring of the pressure, the pressure in the supply path after a predetermined time elapses from stopping of the supply of the gas in the supplying of the gas is measured, and in the determining, the placing state of the edge ring on the ring placing surface is determined based on whether the pressure in the supply path measured in the measuring of the pressure is less than a threshold value.

(6) The substrate processing system according to any one of (1) to (5), in which the transfer robot has a holder configured to hold a substrate to be transferred, and a measurement unit that is provided in the holder and that measures information related to a misalignment amount of the edge ring with respect to the electrostatic chuck, and when a determination that the placing state of the edge ring on the ring placing surface is not appropriate is made, the controller further controls performing measurement via the measurement unit, and calculating the misalignment amount of the edge ring based on a measurement result of the measurement unit.

(7) The substrate processing system according to (6), in which when the calculated misalignment amount exceeds a threshold value, the controller further controls adjusting a position of the edge ring on the ring placing surface.

(8) The substrate processing system according to (7), in which the adjusting includes releasing the electrostatic attracting of the edge ring, raising the edge ring via the elevation mechanism, and then transferring the edge ring to the transfer robot, then moving the edge ring to a position based on the calculated misalignment amount, and then returning the edge ring to the elevation mechanism and then lowering the edge ring via the elevation mechanism and placing the edge ring on the ring placing surface again.

(9) The substrate processing system according to any one of (1) to (8), in which the transfer robot has the holder configured to hold the edge ring to be transferred, and the measurement unit that is provided in the holder and that measures the information related to the misalignment amount of the edge ring with respect to the electrostatic chuck, and when a determination that the placing state of the edge ring on the ring placing surface is appropriate is made, the controller further controls performing measurement via the measurement unit, and calculating the misalignment amount of the edge ring based on the measurement result of the measurement unit.

(10) The substrate processing system according to (9), in which when the calculated misalignment amount exceeds the threshold value, the controller further controls adjusting a position of the edge ring on the ring placing surface.

(11) The substrate processing system according to (9) or (10), in which when the calculated misalignment amount is less than or equal to the threshold value, the controller further controls performing processing of stabilizing the electrostatic attracting of the edge ring.

(12) The substrate processing system according to any one of (1) to (8), in which when a determination that the placing state of the edge ring on the ring placing surface is appropriate is made, the controller further controls performing processing of stabilizing the electrostatic attracting of the edge ring.

(13) The substrate processing system according to any one of (1) to (12), in which the gas is a heat transfer gas.

(14) The substrate processing system according to any one of (1) to (13), in which the plasma processing apparatus further has an exhaust path for exhausting air between the rear surface of the edge ring and the ring placing surface, and the controller further controls vacuum-attracting the edge ring to the ring placing surface before electrostatically attracting the edge ring placed on the ring placing surface to the ring placing surface.

(15) A substrate processing system including a plasma processing apparatus, a pressure-reduced transfer device connected to the plasma processing apparatus, and a controller, in which the plasma processing apparatus has a processing container configured to be pressure-reduced, a substrate support that is provided in the processing container and that includes a substrate placing surface, a ring placing surface on which an edge ring is placed to surround the substrate placing surface, and an electrostatic chuck that electrostatically attracts the edge ring to the ring placing surface, an elevation mechanism that elevates the edge ring with respect to the ring placing surface, and a supply path for supplying a gas to a space between a rear surface of the edge ring and the ring placing surface, the pressure-reduced transfer device has a transfer robot that transfers the edge ring, the transfer robot has a holder configured to hold the edge ring to be transferred, and a measurement unit that is provided in the holder and that measures information related to a misalignment amount of the edge ring with respect to the electrostatic chuck, and the controller controls lowering the edge ring that is transferred into the processing container by the transfer robot and that is transferred to the elevation mechanism, via the elevation mechanism and placing the edge ring on the ring placing surface, electrostatically attracting the placed edge ring to the ring placing surface, performing measurement via the measurement unit after the electrostatic attracting, and calculating the misalignment amount of the edge ring based on a measurement result of the measurement unit.

(16) The substrate processing system according to (15), in which the controller further controls, before the electrostatic attracting, performing measurement via the measurement unit, and calculating the misalignment amount of the edge ring based on the measurement result of the measurement unit.

(17) The substrate processing system according to (15) or (16), in which the electrostatic chuck has a first electrode and a second electrode formed at positions different from each other, and voltages having polarities different from each other and voltages having the same polarity are configured to be supplied to the first electrode and the second electrode.

(18) The substrate processing system according to any one of (15) to (17), in which the plasma processing apparatus further has a gas supply that discharges another gas into the processing container, and in the placing, the edge ring is placed on the ring placing surface while the other gas is discharged into the processing container.

(19) The substrate processing system according to any one of (15) to (18), in which the plasma processing apparatus further has a plasma generator that generates a plasma in the processing container, and in the electrostatic attracting, the edge ring is electrostatically attracted in a state where the plasma is generated in the processing container.

(20) The substrate processing system according to any one of (15) to (19), in which when the calculated misalignment amount exceeds a threshold value, the controller further controls adjusting a position of the edge ring on the ring placing surface.

(21) The substrate processing system according to any one of (15) to (20), in which when the calculated misalignment amount is less than or equal to the threshold value, the controller further controls performing processing of stabilizing the electrostatic attracting of the edge ring.

(22) The substrate processing system according to any one of (15) to (21), in which the plasma processing apparatus further has an exhaust path for exhausting air between the rear surface of the edge ring and the ring placing surface, and the controller further controls vacuum-attracting the edge ring to the ring placing surface before electrostatically attracting the edge ring placed on the ring placing surface to the ring placing surface.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

The invention claimed is:

1. A substrate processing system comprising:

a plasma processing apparatus;

a decompressed transferrer connected to the plasma processing apparatus; and processing circuitry, wherein the plasma processing apparatus includes a processing container being decompressible, a gas supply, a substrate support provided in the processing container, the substrate support including a substrate placing surface, a ring placing surface on which an edge ring is placeable to surround the substrate placing surface, and an electrostatic chuck configured to electrostatically attract the edge ring to the ring placing surface, a lifter configured to vertically move the edge ring with respect to the ring placing surface, a supply path to supply a gas to a space between a rear surface of the edge ring and the ring placing surface, and a pressure sensor connected to the supply path and for measuring a pressure in the supply path, the decompressed transferrer includes a transfer robot configured to transfer the edge ring, and the processing circuitry is configured to control the transfer robot to transfer the edge ring into the processing chamber, control the lifter to lower the edge ring on to the ring placing surface, control the electrostatic chuck to electrostatically attract the edge ring to the ring placing surface, control the gas supply to supply the gas to the supply path to maintain a pressure in the supply path to be higher than a pressure in the processing container after the electrostatic attracting, control the pressure sensor to measure the pressure in the supply path after a predetermined time elapses from stopping the supply of the gas, and determine a placing state of the edge ring on the ring placing surface based on whether the measured pressure in the supply path is less than a threshold.

2. The substrate processing system according to claim 1, wherein the electrostatic chuck includes a first electrode and a second electrode, the first electrode and the second electrode being located at positions different from each other.

3. The substrate processing system according to claim 1, wherein the gas supply is configured to supply another gas into the processing container, and the processing circuitry is further configured to control the lifter to place the edge ring on the ring placing surface while the another gas is supplied into the processing container.

4. The substrate processing system according to claim 1, wherein the plasma processing apparatus further includes a plasma generator configured to generate plasma in the processing container, and the electrostatically attracting includes electrostatically attracting the edge ring with the plasma generated in the processing container.

5. The substrate processing system according to claim 1, wherein the transfer robot includes a holder configured to hold a substrate to be transferred, and a measurer provided in the holder, the measurer being configured to measure information relating to a misalignment amount of the edge ring with respect to the electrostatic chuck, and in response to the processing circuitry determining that the placing state of the edge ring on the ring placing surface is misaligned greater than a threshold amount, the processing circuitry is further configured to:

control the measurer to perform measurement of the edge ring with respect to the electrostatic chuck, and calculate the misalignment amount of the edge ring based on a measurement result of the measurer.

6. The substrate processing system according to claim 5, wherein when the calculated misalignment amount exceeds the threshold, the processing circuitry is further configured to control the transfer robot to adjust a position of the edge ring on the ring placing surface.

7. The substrate processing system according to claim 6, wherein the adjusting includes controlling, by the processing circuitry, the electrostatic chuck to release the electrostatic attracting of the edge ring, raising the edge ring with the lifter, and then transferring the edge ring to the transfer robot, then controlling, by the processing circuitry, the transfer robot to move the edge ring to a new position based on the calculated misalignment amount, then controlling, by the processing circuitry, the transfer robot to return the edge ring to the lifter, then controlling, by the processing circuitry, the lifter to lower the edge ring with the lifter, and placing the edge ring on the ring placing surface again.

8. The substrate processing system according to claim 1, wherein the transfer robot includes a holder configured to hold the edge ring to be transferred, and a measurer provided in the holder, the measurer being configured to measure information related to a misalignment amount of the edge ring with respect to the electrostatic chuck, and in response to the processing circuitry determining that the placing state of the edge ring on the ring placing surface is appropriate, the processing circuitry is further configured to control the measurer to perform performing measurement of the edge ring, and calculate the misalignment amount of the edge ring based on a measurement result of the measurer.

9. The substrate processing system according to claim 8, wherein when the calculated misalignment amount exceeds a threshold, the processing circuitry is further configured to control the transfer robot to adjust a position of the edge ring on the ring placing surface.

10. The substrate processing system according to claim 8, wherein in response to the processing circuitry determining that the calculated misalignment amount is less than or equal to a threshold, the processing circuitry is further configured to control the electrostatic chuck and gas supply to stabilize the electrostatic attracting of the edge ring.

11. The substrate processing system according to claim 1, wherein in response to the processing circuitry determining that the placing state of the edge ring on the ring placing surface is appropriate, the processing circuitry is further configured to control the electrostatic chuck and gas supply to stabilize the electrostatic attracting of the edge ring.

12. The substrate processing system according to claim 1, wherein the gas is a heat transfer gas.

13. The substrate processing system according to claim 1, wherein the plasma processing apparatus further includes an exhaust path to exhaust the gas between the rear surface of the edge ring and the ring placing surface, and a vacuum pump, wherein the processing circuitry is further configured to control the vacuum pump to vacuum-attract the edge ring to the ring placing surface before the electrostatically attracting the edge ring placed on the ring placing surface to the ring placing surface.

14. A substrate processing system comprising:
a plasma processing apparatus;
a decompressed transferrer connected to the plasma processing apparatus; and
processing circuitry,
wherein the plasma processing apparatus includes
a processing container being decompressible,
a substrate support provided in the processing container, the substrate support including a substrate placing surface, a ring placing surface on which an edge ring is placeable to surround the substrate placing surface, and an electrostatic chuck configured to electrostatically attract the edge ring to the ring placing surface,
a lifter configured to vertically move the edge ring with respect to the ring placing surface, and
a supply path to supply a gas to a space between a rear surface of the edge ring and the ring placing surface,
the decompressed transferrer includes a transfer robot configured to transfer the edge ring,
the transfer robot includes
a holder configured to hold the edge ring to be transferred, and
a measurer provided in the holder, the measurer being configured to measure information relating to a misalignment amount of the edge ring with respect to the electrostatic chuck, and
the processing circuitry is configured to
control the lifter to lower the edge ring on the ring placing surface,
control the electrostatic chuck to electrostatically attract the placed edge ring to the ring placing surface,
control the measurer to perform measurement after the electrostatically attracting,
calculate the misalignment amount of the edge ring based on a measurement result of the measurer, and
in response to determining that the calculated misalignment amount is less than or equal to a threshold, control at least the electrostatic chuck to stabilize the electrostatic attracting of the edge ring.

15. The substrate processing system according to claim 14,
wherein the processing circuitry is further configured to, before the electrostatically attracting,
control the measurer to perform measurement, and
calculate the misalignment amount of the edge ring based on the measurement result of the measurer.

16. The substrate processing system according to claim 14,
wherein the electrostatic chuck includes a first electrode and a second electrode, the first electrode and the second electrode being located at positions different from each other.

17. The substrate processing system according to claim 14,
wherein the plasma processing apparatus further includes a gas supply configured to discharge another gas into the processing container, and
wherein the processing circuitry is further configured to control the lifter to place the edge ring on the ring placing surface while the another gas is supplied into the processing container.

18. The substrate processing system according to claim 14,
wherein the plasma processing apparatus further includes a plasma generator configured to generate plasma in the processing container, and
the electrostatically attracting includes electrostatically attracting the edge ring with the plasma generated in the processing container.

19. The substrate processing system according to claim 14,
wherein in response to the processing circuitry determining that the calculated misalignment amount exceeds the threshold, the processing circuitry further controls the transfer robot to adjust a position of the edge ring on the ring placing surface.

20. The substrate processing system according to claim 14,
wherein the plasma processing apparatus further includes
an exhaust path to exhaust the gas between the rear surface of the edge ring and the ring placing surface, and
a vacuum pump,
wherein the processing circuitry is further configured to control the vacuum pump to vacuum attract the edge ring to the ring placing surface before electrostatically attracting the edge ring placed on the ring placing surface to the ring placing surface.

* * * * *